US006725111B2

(12) United States Patent
Naruki et al.
(10) Patent No.: US 6,725,111 B2
(45) Date of Patent: Apr. 20, 2004

(54) METHOD FOR PROCESSING AND REPRODUCING AUDIO SIGNAL AT DESIRED SOUND QUALITY, REDUCED DATA VOLUME OR ADJUSTED OUTPUT LEVEL, APPARATUS FOR PROCESSING AUDIO SIGNAL WITH SOUND QUALITY CONTROL INFORMATION OR TEST TONE SIGNAL OR AT REDUCED DATA VOLUME, RECORDING MEDIUM FOR RECORDING AUDIO SIGNAL WITH SOUND QUALITY CONTROL INFORMATION OR TEST TONE SIGNAL OR AT REDUCED DATA VOLUME, AND APPARATUS FOR REPRODUCING AUDIO SIGNAL AT DESIRED SOUND QUALITY, REDUCED DATA VOLUME OR ADJUSTED OUTPUT LEVEL

(75) Inventors: Hidetoshi Naruki, Zama (JP); Shoji Ueno, Fujisawa (JP)

(73) Assignee: JVC Victor Company of Japan, Ltd., Yokohama (JP)

( * ) Notice: Subject to any disclaimer, the term of this patent is extended or adjusted under 35 U.S.C. 154(b) by 43 days.

(21) Appl. No.: 10/067,084

(22) Filed: Feb. 4, 2002

(65) Prior Publication Data

US 2003/0144755 A1 Jul. 31, 2003

Related U.S. Application Data

(63) Continuation of application No. 09/025,886, filed on Feb. 18, 1998, now Pat. No. 6,377,862.

(30) Foreign Application Priority Data

Feb. 19, 1997 (JP) ............................................. 9-50963
Jul. 7, 1997 (JP) ............................................. 9-196477

(51) Int. Cl.$^7$ ............................ G06F 17/00; H03G 3/00
(52) U.S. Cl. .......................... 700/94; 381/104; 381/107
(58) Field of Search ............................ 700/94; 381/104, 381/102, 107, 109, 22, 23, 101; 84/633; 704/212, 500, 503; 360/32, 55

(56) References Cited

U.S. PATENT DOCUMENTS 5,303,371 A * 4/1994 Nakajima .................. 381/109
5,706,357 A * 1/1998 Yang .......................... 381/107
5,956,494 A * 9/1999 Girardeau, Jr. et al. ..... 381/104
6,072,367 A * 6/2000 Mase ......................... 381/107
6,088,461 A * 7/2000 Lin et al. .................... 381/104
6,377,862 B1 * 4/2002 Naruki et al. ................ 700/94
6,560,497 B2 * 5/2003 Naruki et al. ................ 700/94

* cited by examiner

*Primary Examiner*—Xu Mei
(74) *Attorney, Agent, or Firm*—Anderson Kill & Olick, P.C.; Eugene Lieberstein; Michael N. Meller

(57) ABSTRACT

A digital audio signal obtained from an analog audio signal indicating a music, pieces of audio reproduction control information respectively indicating the adjustment of a sound quality of the music are added to the digital audio signal, and the digital audio signal is recorded with the pieces of audio reproduction control information as packed data. When a user selects a piece of particular audio reproduction control information from the pieces of audio reproduction control information after the packed data is read out, levels of pieces of audio data of the digital audio signal are adjusted according to the particular audio reproduction control information, so that the user can entertain the music at a desired sound quality.

3 Claims, 18 Drawing Sheets

ASD (1000 BYTES)

| | |
|---|---|
| GENERAL INFORMATION | 16 BYTES |
| CURRENT MUSIC ID NO. INFORMATION | 8 BYTES |
| CURRENT DATE AND TIME INFORMATION | 16 BYTES |
| ALBUM SET SEARCH INFORMATION | 8 BYTES |
| ALBUM SEARCH INFORMATION | 8 BYTES |
| TRACK SEARCH INFORMATION | 404 BYTES |
| INDEX SEARCH INFORMATION | 408 BYTES |
| HIGHLIGHT SEARCH INFORMATION | 80 BYTES |
| HOLDING AREA | 52 BYTES |

METHOD FOR PROCESSING AND REPRODUCING AUDIO SIGNAL AT DESIRED SOUND QUALITY, REDUCED DATA VOLUME OR ADJUSTED OUTPUT LEVEL, APPARATUS FOR PROCESSING AUDIO SIGNAL WITH SOUND QUALITY CONTROL INFORMATION OR TEST TONE SIGNAL OR AT REDUCED DATA VOLUME, RECORDING MEDIUM FOR RECORDING AUDIO SIGNAL WITH SOUND QUALITY CONTROL INFORMATION OR TEST TONE SIGNAL OR AT REDUCED DATA VOLUME, AND APPARATUS FOR REPRODUCING AUDIO SIGNAL AT DESIRED SOUND QUALITY, REDUCED DATA VOLUME OR ADJUSTED OUTPUT LEVEL

This is a CONTINUATION of application Ser. No. 09/025,886 filed on Feb. 18, 1998 now U.S. Pat. No. 6,377,862. The entire disclosure of the prior application Ser. No. 09/025,886 is considered a part of the disclosure of this continuation application and is hereby incorporated by reference.

BACKGROUND OF THE INVENTION

1. Field of the Invention

The present invention relates to an audio signal processing and reproducing method for processing and reproducing an audio signal while adjusting a sound quality of a music reproduced by the audio signal, an audio signal processing apparatus for processing an audio signal with sound quality controlling information indicating various sound qualities of a music reproduced by the audio signal, a recording medium for recording an audio signal with sound quality controlling information indicating various sound qualities of a music reproduced by the audio signal, and an audio signal reproducing apparatus for reproducing an audio signal while adjusting a music reproduced by the audio signal to a desired sound quality.

Also, the present invention relates to an audio signal processing and reproducing method for processing and reproducing an audio signal while reducing a volume of data indicating the audio signal, an audio signal processing apparatus for processing an audio signal while reducing a volume of data indicating the audio signal, a recording medium for recording an audio signal in which a volume of data indicating the audio signal is reduced, and an audio signal reproducing apparatus for reproducing an audio signal processed to reduce a volume of data indicating the audio signal. Also, the present invention relates to an audio signal processing and reproducing method for processing and reproducing an audio signal while adjusting an output level of the audio signal, an audio signal processing apparatus for processing an audio signal with a test tone signal to automatically mute an output sound of the test tone signal in a reproducing operation of the audio signal, a recording medium for recording an audio signal with a test tone signal, and an audio signal reproducing apparatus for reproducing an audio signal with a test tone signal while adjusting an output level of the audio signal and muting an output sound of the test tone signal.

2. Description of the Related Art 2.1. First Previously Proposed Art

In general, in cases where an audio signal recorded in a recording medium such as a compact disk (or disc) (CD) or a digital versatile disk (or disc) (DVD) is reproduced by using a speaker, a user can entertain a music reproduced by the audio signal at a desired sound quality when the user manually operates an equalizer of an audio signal reproducing apparatus to appropriately adjust a level of each frequency band such as a low tone or a high tone, a balance of levels of frequency bands, a level balance of speakers of five channels (or right and left channels) and reverberation.

2.2. Second Previously Proposed Art

In a first conventional audio signal reproducing method, when a digital audio signal is written in a CD or DVD as an original signal, a level of the original signal is generally heightened to improve a sound/noise (S/N) ratio in the original signal. Also, in cases where a level of an original signal read out from the CD or DVD is too high, the level of the original signal is lowered in a reproducing operation to prevent the original signal from giving an unpleasant feeling to a listener or to prevent a speaker from being broken. In this case, a user can reproduce the original signal at a desired level by manually adjusting the level of the original signal in the reproducing operation.

Also, in a second conventional audio signal reproducing method, when a test tone recorded in a disk (or disc) at a maximum level for each channel of a stereo or multichannel is reproduced, an operator manually mutes an output sound including the test tone and manually adjusts the balance of levels of the test tones in a plurality of channels while observing the levels indicated in a level meter.

2.3. Problems to be Solved by the Invention

However, when the user entertains a music at a desired sound quality, the user is required to manually operate many buttons for appropriately adjusting a level of each frequency band, a balance of levels of frequency bands, a level balance of speakers of five channels and reverberation. Also, to appropriately adjust the buttons, a skillful person having a superior keen sense of hearing such as a professional mixer is required. Therefore, the user cannot hear a music at a desired sound quality.

Also, in the first conventional audio signal reproducing method, because a level of an original digital audio signal is shifted and the signal is recorded, the user is required to adjust the level of the signal when the user reproduces the signal at an original level thereof. Therefore, there is a drawback that the digital audio signal cannot be automatically reproduced at the original level.

Also, in the second conventional audio signal reproducing method, because it is required to record one test tone in each of all recording blocks of a disk (or disc), a recording area of the disk (or disc) cannot be efficiently used for digital recording signals. To prevent this drawback, there is an idea that each of test tones is recorded in an area of the disk (or disc) with a mute flag and an output of an audio signal for which one mute flag is set is muted. In this idea, the burden for watching the mute flags is increased in an audio signal reproducing apparatus when an occurrence frequency of the mute flags is heightened. For example, one mute flag is set for each frame (1/600 second). Also, when an occurrence frequency of the mute flag is lowered, a fine mute control for the audio signal cannot be performed.

SUMMARY OF THE INVENTION

A first object of the present invention is to provide, with due consideration to the drawbacks of such a conventional audio signal reproducing method, an audio signal processing and reproducing method in which an audio signal is reproduced at a simple operation on condition that a sound quality of a music indicated by the audio signal is appropriately set, an audio signal processing apparatus in which an audio signal is processed to be reproduced at a desired sound quality, a recording medium in which an audio signal processed by the audio signal processing apparatus is recorded, and an audio signal reproducing apparatus in which an audio signal processed by the audio signal processing apparatus is reproduced at a desired sound quality.

A second object of the present invention is to provide an audio signal processing and reproducing method in which an audio signal is processed at reduced data volume and is automatically reproduced at an original level, an audio signal processing apparatus in which an analog audio signal is processed while reducing a volume of data indicating the analog audio signal, a recording medium in which digital audio signal expressing an analog audio signal at a reduced data volume is recorded and an audio signal reproducing apparatus in which an analog audio signal expressed at a reduced data volume is reproduced.

A third object of the present invention is to provide an audio signal processing and reproducing method in which an audio signal is processed with a test tone signal and the audio signal is easily reproduced at an output level adjusted according to the test tone signal without giving an unpleasant feeling based on an output sound of the test tone signal to a user, an audio signal processing apparatus in which an audio signal is processed with a test tone signal to be reproduced without giving an unpleasant feeling based on an output sound of the test tone signal to a user, a recording medium in which an audio signal processed with a test tone signal is recorded and an audio signal reproducing apparatus in which an audio signal processed with a test tone signal is easily reproduced without giving an unpleasant feeling based on an output sound of the test tone signal to a user.

The first object is achieved by the provision of an audio signal processing and reproducing method, comprising the steps of:

converting an analog audio signal of a channel into a digital audio signal composed of a plurality of pieces of audio data;

adding a plurality of pieces of sound quality control information, which each denote information for adjusting a sound quality of a music indicated by the analog audio signal, to the digital audio signal;

recording a set of the digital audio signal and the pieces of sound quality control information;

reading out the set of the digital audio signal and the pieces of sound quality control information;

selecting a piece of particular sound quality control information from the pieces of sound quality control information;

adjusting levels of the pieces of audio data of the digital audio signal according to the particular sound quality control information to produce a sound quality adjusted digital audio signal composed of a plurality of pieces of sound quality adjusted audio data having adjusted levels; and outputting the sound quality adjusted digital audio signal.

The first object is also achieved by the provision of an audio signal processing apparatus, comprising:

analog-digital converting means for converting an analog audio signal of a channel into a digital audio signal composed of a plurality of pieces of audio data; and audio signal encoding means for adding a plurality of pieces of sound quality control information, which each denote information for adjusting a sound quality of a music indicated by the analog audio signal, to the digital audio signal and encoding the digital audio signal and the pieces of sound quality control information to produce packed data, the packed data being transmitted or recorded.

In the above steps and configuration, a plurality of pieces of sound quality control information are added to a digital audio signal obtained from an analog audio signal indicating a music. Because each piece of sound quality control information denotes information for adjusting a sound quality of the music and the digital audio signal is recorded with the pieces of sound quality control information as packed data, when a user selects a piece of particular sound quality control information from the pieces of sound quality control information after the packed data is read out, levels of the pieces of audio data of the digital audio signal are adjusted according to the particular sound quality control information, and a sound quality adjusted digital audio signal is obtained.

Accordingly, the user can easily entertain a music adjusted at a desired sound quality.

The first object is also achieved by the provision of an audio signal recording medium, comprising:

a first data area for recording an digital audio signal composed of a plurality of pieces of audio data which are obtained by sampling an analog audio signal of a channel at a high sampling frequency; and a second data area for recording a plurality of pieces of sound quality control information, which each denote information for adjusting a sound quality of a music indicated by the digital audio signal recorded in the first data area.

In the above configuration, an digital audio signal indicating a music can be recorded with a plurality of pieces of sound quality control information respectively denoting information for adjusting a sound quality of the music. Therefore, in cases where the digital audio signal is read out with the pieces of sound quality control information, a sound quality of the music can be adjusted to a desired sound quality according to one of the pieces of sound quality control information.

The first object is also achieved by the provision of an audio signal reproducing apparatus for reproducing an analog audio signal from packed data composed of a series of audio data, which is obtained by converting the analog audio signal of a channel, and a plurality of pieces of sound quality control information, which each denote information for adjusting a sound quality of a music indicated by the analog audio signal, comprising:

audio signal decoding means for decoding the packed data to reproduce the series of audio data and the pieces of sound quality control information;

operating means for receiving a user's instruction requesting the selection of a piece of particular sound quality control information from the pieces of sound quality control information reproduced by the audio signal decoding means;

selecting means for selecting the piece of particular sound quality control information according to the user's instruction received by the operating means;

signal processing means for adjusting levels of the pieces of audio data reproduced by the audio signal decoding means according to the piece of particular sound quality control information selected by the selecting means to produce a series of sound quality adjusted audio data; and audio data outputting means for outputting the series of sound quality adjusted audio data produced by the signal processing means.

In the above configuration, because a piece of particular sound quality control information is selected by a user in the operating means and the selecting means, a series of sound quality adjusted audio data is produced by adjusting levels of the pieces of audio data according to the piece of particular sound quality control information. Therefore, the user can easily entertain a music adjusted to a desired sound quality.

The second object is achieved by the provision of an audio signal processing and reproducing method, comprising the steps of:

converting an analog audio signal of a channel into a digital audio signal composed of a plurality of pieces of audio data;

shifting original levels of the pieces of audio data of the digital audio signal by a particular differential level to produce a level-shifted digital audio signal composed of a plurality of pieces of level-shifted audio data having shifted levels;

producing level shift control data indicating the particular differential level;

transmitting or recording the level-shifted digital audio signal and the level shift control data; and returning the shifted levels of the pieces of level-shifted audio data of the level-shifted digital audio signal transmitted or recorded to the original levels according to the level shift control data transmitted or recorded with the level-shifted digital audio signal to reproduce the pieces of audio data of the digital audio signal having the original levels.

The second object is also achieved by the provision of an audio signal processing apparatus, comprising:

analog-digital converting means for converting an analog audio signal of a channel into a plurality of pieces of audio data of a digital audio signal;

level shifting means for shifting original levels of the pieces of audio data of the digital audio signal obtained by the analog-digital converting means by a particular differential level to produce a plurality of pieces of level-shifted audio data of a level-shifted digital audio signal having shifted levels;

level shift control data producing means for producing level shift control data indicating the particular differential level; and audio signal encoding means for encoding a set of the pieces of level-shifted audio data obtained by the level shifting means and the level shift control data produced by the level shift control data producing means to produce packed data, the packed data being transmitted or recorded.

In the above steps and configuration, because the level shift control data is transmitted or recorded with the level-shifted digital audio signal, even though the original levels of the pieces of audio data of the digital audio signal are shifted to the shifted levels, the shifted levels of the pieces of level-shifted audio data can be automatically returned to the original levels of the pieces of audio data of the digital audio signal.

The second object is also achieved by the provision of an audio signal recording medium, comprising:

a first data area for recording a series of level-shifted audio data having shifted levels which is obtained by converting an analog audio signal of a channel into pieces of audio data and shifting original levels of the pieces of audio data by a particular differential level to the shifted levels; and a second data area for recording level shift control data indicating the particular differential level.

In the above configuration, the series of level-shifted audio data having the shifted levels and the level shift control data can be recorded as packed data.

The second object is also achieved by the provision of an audio signal reproducing apparatus for reproducing an analog audio signal from packed data composed of a series of level-shifted audio data having shifted levels, which is obtained by converting the analog audio signal of a channel into pieces of audio data and shifting original levels of the pieces of audio data by a particular differential level to the shifted levels, and level shift control data indicating the particular differential level, comprising:

audio signal decoding means for decoding the packed data to reproduce the series of level-shifted audio data and the level shift control data; and signal processing means for returning the shifted levels of the pieces of level-shifted audio data obtained by the audio signal decoding means to the original levels to reproduce the pieces of audio data according to the level shift control data.

In the above configuration, in cases where packed data composed of a series of level-shifted audio data and level shift control data are recorded in a recording medium such as a digital versatile disk, the packed data is decoded to the series of level-shifted audio data and the level shift control data in the audio signal decoding means. Thereafter, the shifted levels of the pieces of level-shifted audio data are returned to the original levels according to the level shift control data in the signal processing means.

Accordingly, in cases where an analog audio signal of a channel is converted into the packed data in an processing apparatus, because the digital audio signal can be automatically reproduced from the packed data, a user can entertain a music indicated by the analog audio signal.

The third object is achieved by the provision of an audio signal processing and reproducing method, comprising the steps of:

converting a series of analog audio signals, into which a test tone signal is inserted, into a series of digital audio signals including a test tone digital signal obtained by converting the test tone signal;

arranging each of the digital audio signals in an audio pack;

arranging the test tone digital signal in a test tone audio pack to produce a series of audio packs including the test tone audio pack;

dividing the series of audio packs including the test tone audio pack into a plurality of groups of audio packs;

allocating an audio control pack, in which control information is arranged, to each group of audio packs to set the control information and one group of digital audio signals arranged in one group of audio packs as packed data;

adding mute control information indicating the performance of a mute control to the control information of one piece of packed data in cases where the test tone digital signal is included in the piece of packed data;

recording the pieces of packed data;

reading out the pieces of packed data;

decoding the pieces of packed data to reproduce the control information and one group of digital audio signals from each piece of packed data, the mute control information being reproduced from one piece of packed data in which the test tone digital signal is included;

adjusting levels of the digital audio signals reproduced from the pieces of packed data according to the test tone digital signal;

outputting a sound indicated by one group of digital audio signals reproduced from one piece of packed data for each piece of packed data in cases where any mute control information is not included in the control information of the packed data; and muting a sound of one group of digital audio signals reproduced from one piece of packed data according to the mute control in cases where the mute control information is included in the control information of the packed data.

The third object is also achieved by the provision of an audio signal processing apparatus, comprising:

analog-digital converting means for converting a plurality of analog audio signals, into which a test tone signal is inserted, into a plurality of digital audio signals respectively composed of a plurality of pieces of audio data, the test tone signal being converted into a test tone digital signal;

audio signal processing means for arranging each of the digital audio signals produced by the analog-digital converting means in an audio pack and arranging the test tone digital signal in a test tone audio pack;

audio signal coding means for dividing the audio packs and the test tone audio pack into a plurality of groups of audio packs, allocating an audio control pack, in which control information is arranged, to each group of audio packs to set the control information and one group of digital audio signals as packed data for each group of digital audio signals, adding mute control information indicating the performance of a mute control to the control information of one audio control pack, in cases where the test tone audio pack is included in one group of audio packs, and transmitting pieces of packed data to mute a sound of one group of digital audio signals of one piece of packed data in cases where the mute control information is included in the control information of the series of packed data.

The third object is also achieved by the provision of an audio signal reproducing apparatus for reproducing a series of analog audio signals, into which a test tone signal is inserted, from a series of packed data, which are obtained by converting the series of analog audio signals into a series of digital audio signals, converting the test tone signal into a test tone digital signal, arranging each of the digital audio signals in an audio pack, arranging the test tone digital signal in a test tone audio pack to produce a series of audio packs including the test tone audio pack, dividing the series of audio packs including the test tone audio pack into a plurality of groups of audio packs, allocating an audio control pack, in which control information is arranged, to each group of audio packs to set the control information and one group of digital audio signals arranged in one group of audio packs as packed data, and adding mute control information indicating the performance of a mute control to the control information of one piece of packed data in cases where the test tone digital signal is included in the piece of packed data, comprising:

audio signal decoding means for decoding the pieces of packed data to reproduce the control information and one group of digital audio signals for each piece of packed data, the mute control information being reproduced from one piece of packed data in which the test tone digital signal is included;

signal processing means for adjusting levels of the digital audio signals reproduced from the pieces of packed data by the audio signal decoding means according to the test tone digital signal;

control means for judging for each piece of control information whether or not the mute control information is included in the control information reproduced by the audio signal decoding means and outputting a mute control instruction to perform the mute control for a particular group of digital audio signals of a piece of particular packed data in cases where the mute control information is included in the control information of the piece of particular packed data; and mute control performing means for performing the mute control to mute an output sound of the particular group of digital audio signals according to the mute control instruction output from the control means and outputting a sound of the groups of digital audio signals other than the particular group of digital audio signals.

In the present invention, a test tone signal set to a known high level is inserted into a series of analog audio signals indicating a music, and levels of the analog audio signals are adjusted according to the test tone signal in an audio signal reproducing operation by setting the known high level of the test tone signal to a prescribed level. In this case, because the test tone signal is set to the high level, an output sound of the test tone signal gives an unpleasant feeling to a listener or a speaker is broken by the output sound. To prevent this drawback, an output sound of the test tone signal is muted while a sound of the analog audio signals indicating a music is output.

In the above steps and configuration, each digital audio signal produced from one analog audio signal is arranged in one audio pack, control information is arranged in an audio control pack, packed data is composed of control information arranged in one audio control pack and a group of digital audio signals arranged in a group of audio packs, and pieces of packed data are recorded.

In this case, a test tone digital signal produced from a test tone signal is arranged in a test tone audio pack, and mute control information is added to the control information of one piece of packed data in cases where the test tone digital signal is included in the piece of packed data.

Thereafter, the pieces of packed data are read out and decoded to reproduce the control information and one group of digital audio signals from each piece of packed data, and levels of the digital audio signals of the pieces of packed data are adjusted according to the test tone digital signal. Also, in cases where the mute control information is included in one piece of control information, a sound indicated by one group of digital audio signals relating to the control information is muted. Therefore, even though a sound indicated by the digital audio signals is output, the test tone signal does not give an unpleasant feeling to a user.

The third object is also achieved by the provision of an audio signal recording medium, comprising:

a plurality of first data areas for respectively recording a series of first packed data obtained by converting a plurality of analog audio signals, into which a test tone signal is inserted, into a plurality of digital audio signals, arranging each of the digital audio signals in an audio pack, dividing the audio packs into a plurality of groups of audio packs, allocating a first audio control pack, in which control information indicating the control of the digital audio signals is arranged, to each group of audio packs to set the control information and one group of digital audio signals as one series of first packed data; and a second data area for recording a series of second packed data obtained by converting a test tone signal inserted into the plurality of analog audio signals into a test tone digital signal, arranging the test tone digital signal in a test tone audio pack and allocating a second audio control pack, in which control information indicating the control of the digital audio signals and mute control information indicating the performance of a mute control are arranged, to the test tone audio pack and one or more audio packs relating to one or more digital audio signals obtained from one or more analog audio signals adjacent to the test tone signal to set the control information, the mute control information and the digital audio signals as the series of second packed data, a sound of digital audio signals being muted according to the mute control in cases where the series of second packed data is reproduced.

In the above configuration, each series of packed data in which the control information having no mute control information and one group of digital audio signals are packed is recorded in one first data area, and a series of packed data in which the control information having the mute control information and one group of digital audio signals are packed is recorded in the second data area. Therefore, even though a series of analog audio signals into which a test tone signal is inserted is converted into digital audio signals and a test tone digital signal, the digital audio signals can be recorded with the control information having no mute control information, and the test tone digital signal can be recorded with the control information having the mute control information.

BRIEF DESCRIPTION OF THE DRAWINGS

The objects, features and advantages of the present invention will be apparent from the following description taken in conjunction with the accompanying drawings, in which.

DETAILED DESCRIPTION OF THE EMBODIMENTS

Preferred embodiments of an audio signal processing and reproducing method, an audio signal processing apparatus, a recording medium and an audio signal reproducing apparatus according to the present invention are described with reference to the drawings.

Figure 1:
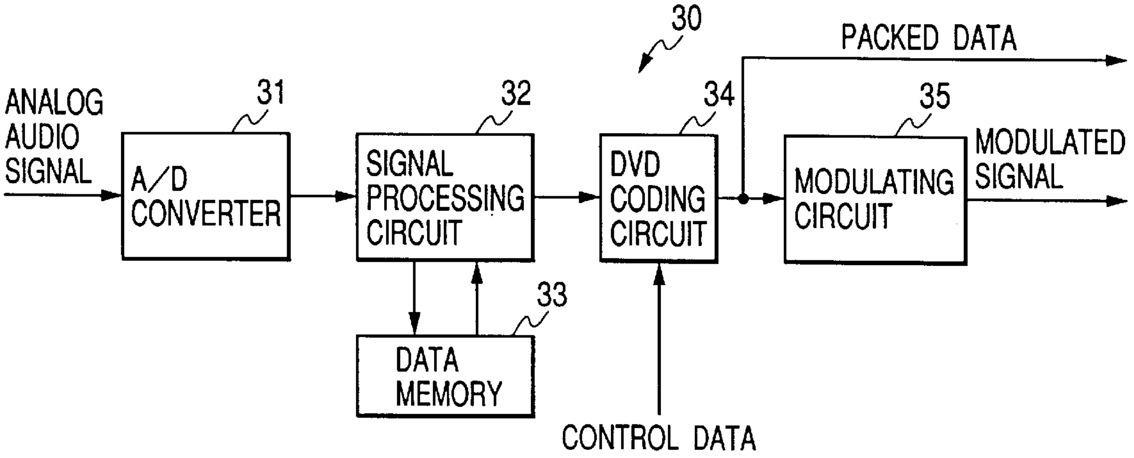
FIG. 1 is a block diagram of an audio signal processing apparatus used for performing an audio signal processing and reproducing method according to a first embodiment.

FIG. 1 is a block diagram of an audio signal processing apparatus used for performing an audio signal reproducing method according to a first embodiment.

As shown in FIG. 1, an audio signal processing apparatus 30 comprises:

- an analog-digital (A/D) converter 31 for receiving an analog audio signal for each of a plurality of channels and sampling each analog audio signal at a high sampling frequency to convert the analog audio signal to a pulse code modulation (PCM) digital audio signal composed of a series of PCM audio data;
- a signal processing circuit 32 for processing the PCM digital audio signal by producing a band limited digital audio signal composed of a series of band limited audio data from the PCM digital audio signal for each channel, producing a sampling frequency reduced signal composed of a series of sampling frequency reduced data from the band limited digital audio signal for each channel, producing a thinned-out audio signal composed of a series of thinned-out audio data from the PCM digital audio signal for each channel and producing a differential audio signal composed of a series of differential audio data from the thinned-out audio signal and the sampling frequency reduced signal for each channel and producing a series of user data composed of one series of sampling frequency reduced data and one series of differential audio data for each channel;
- a data memory 33 for temporarily storing the series of PCM audio data, the series of band limited audio data, the series of sampling frequency reduced data, the series of thinned-out audio data and the series of differential audio data produced in the signal processing circuit 32;
- a DVD encoding circuit 34 for encoding and packing a plurality of series of user data and pieces of control data including sound quality control data to produce packed data for each channel; and
- a modulating circuit 35 for modulating the packed data to a modulated signal.

In the above configuration, an operation of the audio signal processing apparatus 30 is described.

Figure 2:
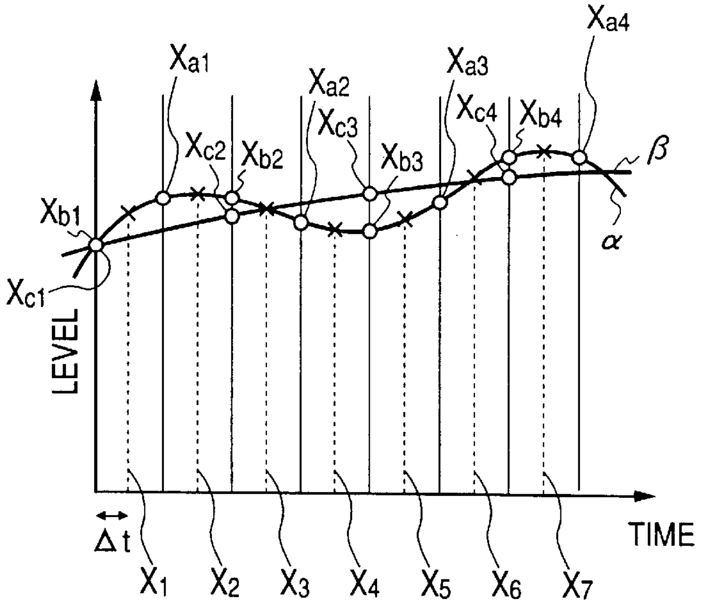
FIG. 2 shows a series of PCM audio data sampled at a sampling frequency (a curved line $\alpha$) and a series of band limited audio data (a curved line $\beta$) according to the first embodiment.

In the A/D converter 31, analog audio signals of six channels are, for example, received, and each analog audio signal is sampled at a high sampling frequency such as 192 kHz, so that a PCM digital audio signal having a high resolution is produced from each analog audio signal. As shown in FIG. 2, each PCM digital audio signal is composed of a series of PCM audio data (Xb1, X1, Xa1, X2, Xb2, X3, Xa2, - - - , Xbi, X2i−1, Xai, X2i, - - - ) arranged along a curved line $\alpha$. Here, each piece of PCM audio data is, for example, expressed by 24 bits, and the symbol "i" is a positive integral number. Thereafter, the series of PCM audio data {Xbi, X2i−1, Xai, X2i} is encoded in the signal processing circuit 32, and a series of user data is produced for each channel.

Figure 3:
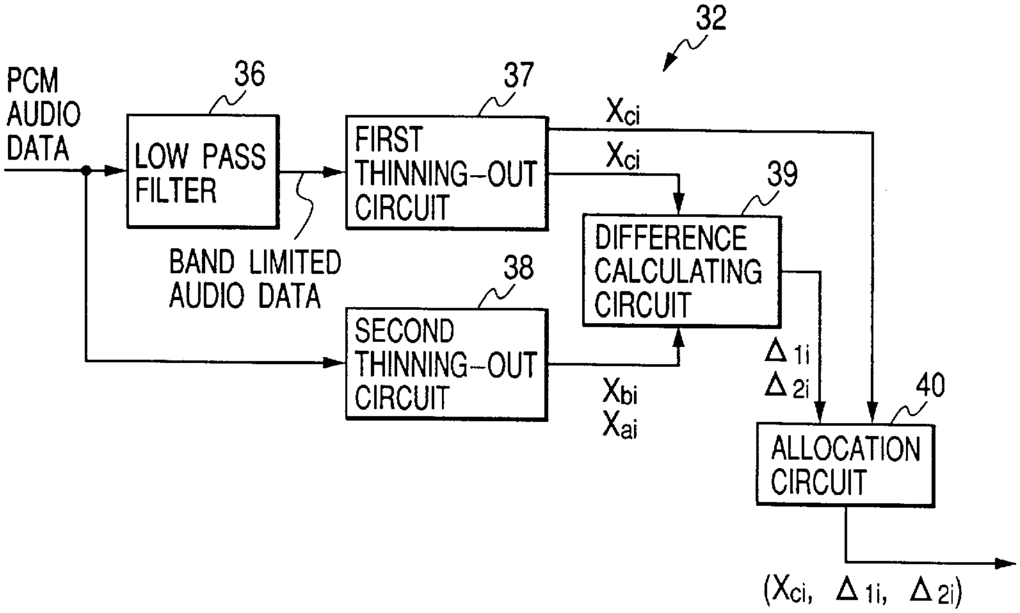
FIG. 3 is a block diagram of a signal processing circuit of the audio signal processing apparatus shown in FIG. 1.

FIG. 3 is a block diagram of the signal processing circuit 32.

As shown in FIG. 3, a frequency band of the series of PCM audio data {Xbi, X2i−1, Xai, X2i} is limited to half in a low pass filter 36 such as a finite-duration impulse-response (FIR) filter. Therefore, as shown in FIG. 2, a series of band limited audio data (Xc1, *, *, *, Xc2, *, *, *, Xc3, *, *, *, - - - , Xci, *, *, *, - - - ) arranged along a curved line $\beta$ is produced as a band limited digital audio signal from the series of PCM audio data {Xbi, X2i−1, Xai, X2i} for each channel. Here, the symbol "*" denotes one piece of band limited audio data. Thereafter, in a first thinning-out circuit 371, the data "*" are removed from the series of band limited audio data, and a series of sampling frequency reduced data (Xc1, Xc2, Xc3, - - - ,Xci, - - - ) is produced as a sampling frequency reduced signal from the series of band limited audio data for each channel. The series of sampling frequency reduced data {Xci} denotes a data series obtained by band-limiting the series of PCM audio data {Xbi, X2i−1, Xai, X2i} and reducing the sampling frequency (192 kHz) to ¼. Also, in a second thinning-out circuit 38, the pieces of data Xi are removed from the PCM audio data, and a series of thinned-out audio data (Xb1, Xa1, Xb2, Xa2, - - - , Xbi, Xai, - - - ) is produced as a thinned-out audio signal from the PCM audio data for each channel.

Thereafter, in a difference calculating circuit 39 composed of an adder, a difference $\Delta 1i = Xbi - Xci$ and a difference $\Delta 2i = Xai - Xci$ are calculated, so that a series of differential audio data {Δ1i} and a series of differential audio data {Δ2i} are produced from the series of sampling frequency reduced data {Xci} and the series of thinned-out audio data {Xbi, Xai} for each channel. The differential audio data Δ1i and Δ2i can be respectively expressed by 24 bits (=3 bytes) or less, so that the number of bits expressing each piece of differential data is fixed to 24 or is variable.

Figure 4:
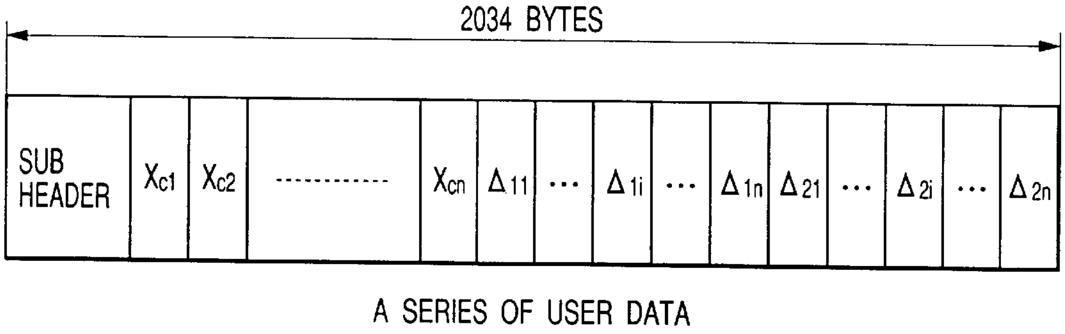
FIG. 4 shows a series of user data produced in an allocation circuit of the signal processing circuit shown in FIG. 4.

Thereafter, in an allocation circuit 40, the series of sampling frequency reduced data {Xci}, the series of differential audio data {Δ1i} and the series of differential audio data {Δ2i} are packed to produce a series of user data {Xci, Δ1i, Δ2i} for each channel. In this case, as shown in FIG. 4, when the series of user data is recorded in a DVD, because one series of user data {Xci, Δ1i, Δ2i} including a sub-header expressed by 9 bytes is expressed by 2034 bytes, the number of sampling frequency reduced data Xci, the number of differential audio data Δ1i and the number of differential audio data Δ2i are respectively 225 in one series of user data {Xci, Δ1i, Δ2i}.

Thereafter, as shown in FIG. 1, in the DVD encoding circuit 34, pieces of control data described later and a plurality of series of user data are packed to produce packed data. Thereafter, in the modulating circuit 35, the packed data is modulated to a modulated signal for each channel according to a modulation type depending on a recording medium such as DVD. Thereafter, the modulated signal is recorded in the recording medium or is transmitted to another apparatus through a transmission line.

Also, packed data relating to a video signal is produced in the same manner for each channel.

Figure 5A:
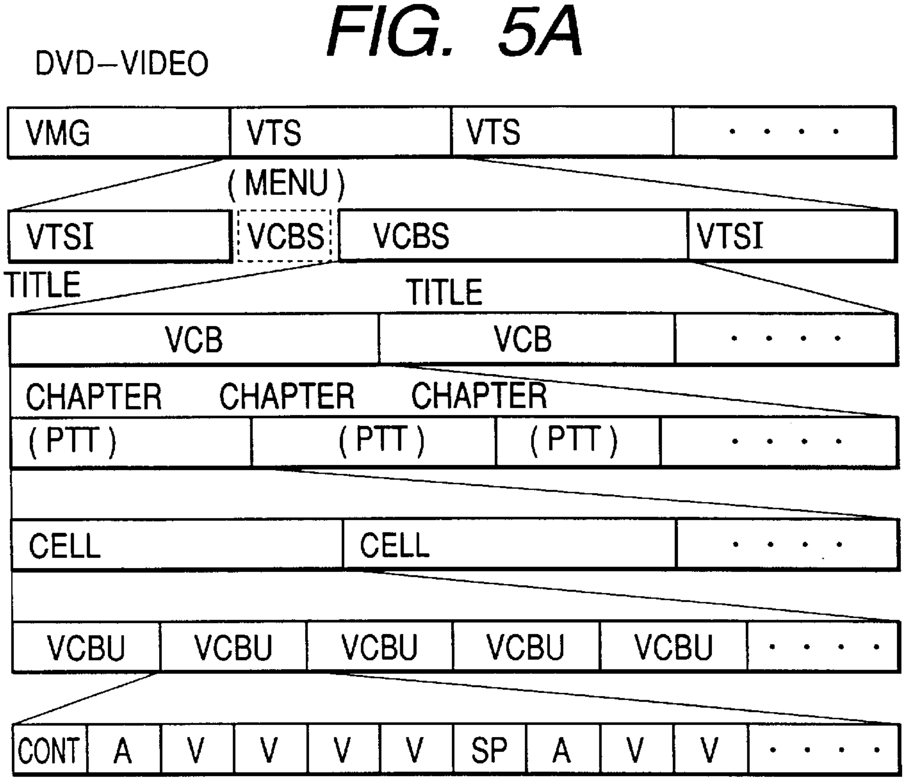
FIG. 5A shows a DVD-video format relating to a video signal recorded in a DVD.
Figure 5B:
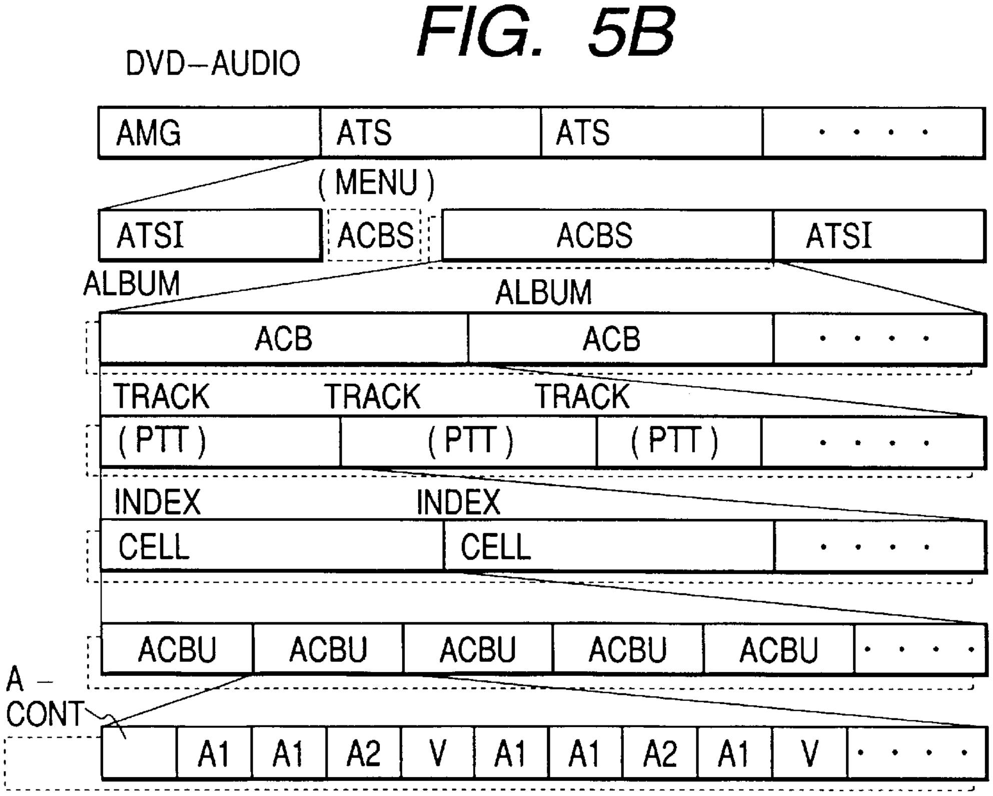
FIG. 5B shows a DVD-audio format for the series of user data and control data corresponding to an audio signal.

Next, a DVD-audio format used for each piece of packed data to record each modulated signal in a DVD is described with reference to FIGS. 5A to 12. FIG. 5A shows a DVD-video format for video signals recorded in a DVD, and FIG. 5B shows a DVD-audio format for audio signals. Though area names in the DVD-audio format differ from those in the DVD-video format, the DVD-audio format and the DVD-video format are compatible with each other.

As shown in FIG. 5A and FIG. 5B, the DVD-video format is composed of a top area of a video manager (VMG) and succeeding areas of a plurality of video title sets (VTS), and the DVD-audio format is composed of a top area of an audio manager (AMG) and succeeding areas of a plurality of audio title sets (ATS).

Each VTS is composed of an area of top VTS information (VTSI), areas of a plurality of video contents block sets (VCBS) and an area of a final VTS information (VTSI) arranged in that order, and each ATS is composed of an area of top ATS information (ATSI), areas of a plurality of audio contents block sets (ACBS) and an area of a final ATS information (ATSI) arranged in that order.

Each VCBS is composed of a plurality of video contents block (VCB), and each VCB is composed of a plurality of chapters. Each chapter includes a part-of-title (PTT). Also, each ACBS is composed of a plurality of audio contents block (ACB), and each ACB is composed of a plurality of tracks. Each track includes a part-of-title (PTT).

Each chapter is composed of a plurality of cells, each cell is composed of a plurality of VCB units (VCBU), and each VCBU is composed of a plurality of packs. Also, each track is composed of a plurality of indexes, each index is composed of a plurality of ACB units (ACBU), and each ACBU is composed of a plurality of packs. Each pack of the ACBU (or the VCBU) is composed of 2048 bytes.

The packs of the VCBU are classified into a navigation control (CONT) pack placed in the top area, a plurality of video (V) packs, a plurality of audio (A) packs and a plurality of sub-picture (SP) packs. Information for controlling the video packs is arranged in the CONT pack. Also, the packs of the ACBU are classified into an audio-control (A-CONT) pack placed in the top area, a plurality of audio (A) packs and a plurality of video (V) packs. Information for controlling the audio packs is arranged in the A-CONT pack. The series of user data included in the packed data is arranged in each audio pack, and the control data other than the series of user data is arranged in each audio-control pack. In the same manner, a series of user data relating to a video signal is arranged in each video pack, and control data relating to the video signal is arranged in each CONT pack.

Figure 6:
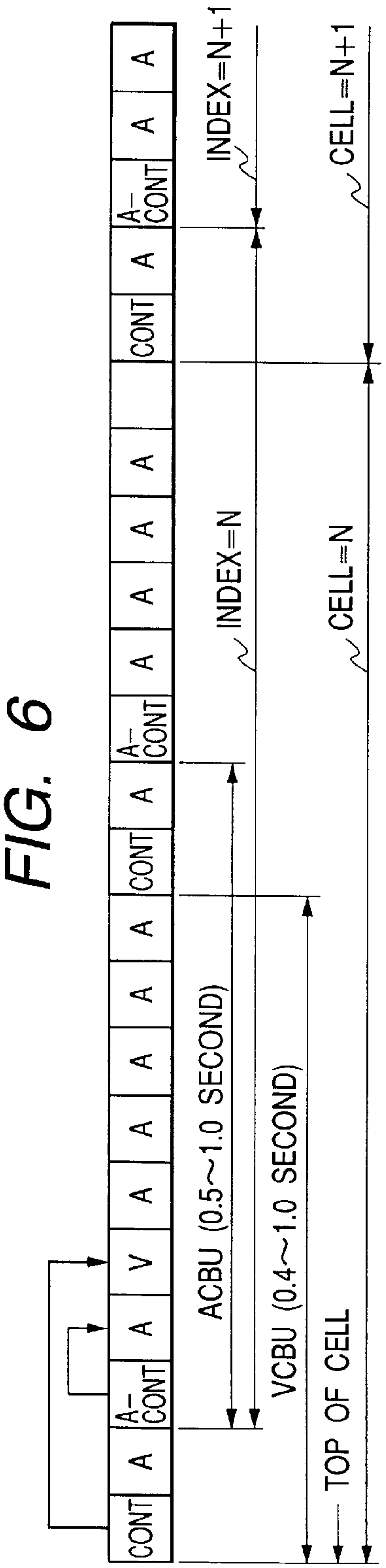
FIG. 6 shows the configuration of an audio contents block unit arranged in the DVD-audio format and the configuration of a video contents block unit arranged in the DVD-video format.

As shown in FIG. 6, each VCB unit is composed of a plurality of packs corresponding to a time period ranging from 0.4 to 1.0 second, and each ACB unit is composed of a plurality of packs corresponding to a time period ranging from 0.5 to 1.0 second. Also, the A-CONT pack in the ACR unit of the DVD-audio format is arranged as the third pack in the VCB unit of the DVD-video format. The A-CONT pack is basically arranged for each audio time of 0.5 second, and a final pair of A-CONT packs placed in an end portion of each index are spaced by a time period ranging from 0.5 to 1.0 second. Also, a group of audio frame units (GOF) corresponding to one audio time is indicated by the A-CONT pack, and a position of data of the A-CONT pack is determined by the number of audio frames, the number of first access unit pointers and the number of frame headers. Also, it is not required that the A pack just before the A-CONT pack is packed at an interval of the audio time of 0.5 second.

Figure 7:
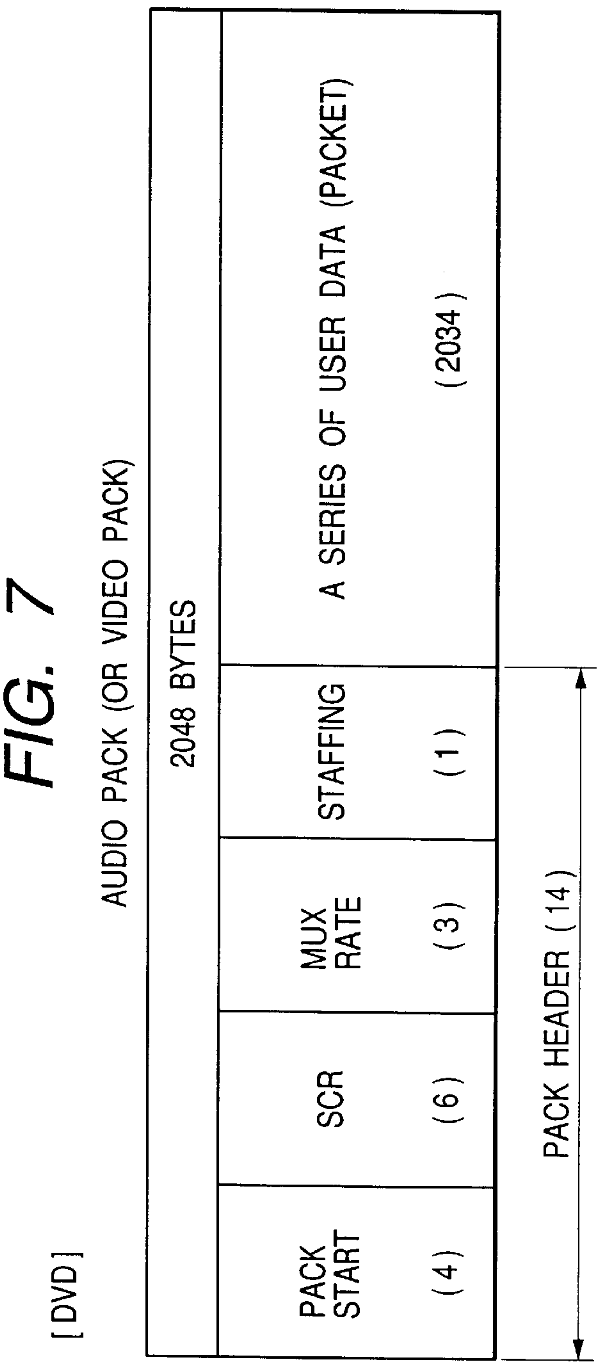
FIG. 7 shows a data format of an audio pack (or a video pack) of the DVD-audio format (or the DVD-video format) in which a series of user data is arranged.

A pair of audio packs A1 adjacent to each other are arranged to correlate audio signals with each other. For example, an audio pack A1 of an L-channel audio signal is adjacent to an audio pack A1 of a R-channel audio signal in case of a stereo. Also, a plurality of adjacent audio packs A1 of audio signals in a multichannel such as 6 channels are arranged to correlate a plurality of audio signals of the adjacent audio packs A1 with each other. In cases where a video is displayed when an audio signal is reproduced, a video pack of the video is arranged in adjacent to an audio pack of the audio signal. As shown in FIG. 7, pack start information of 4 bytes, SCR information of 6 bytes, multiplex (MUX) rate information of 3 bytes, a staffing of 1 byte and one series of user data produced in the audio signal processing apparatus 30 (or one series of user data relating to a video signal) are arranged in that order in each audio pack (or each video pack).

Figure 8:
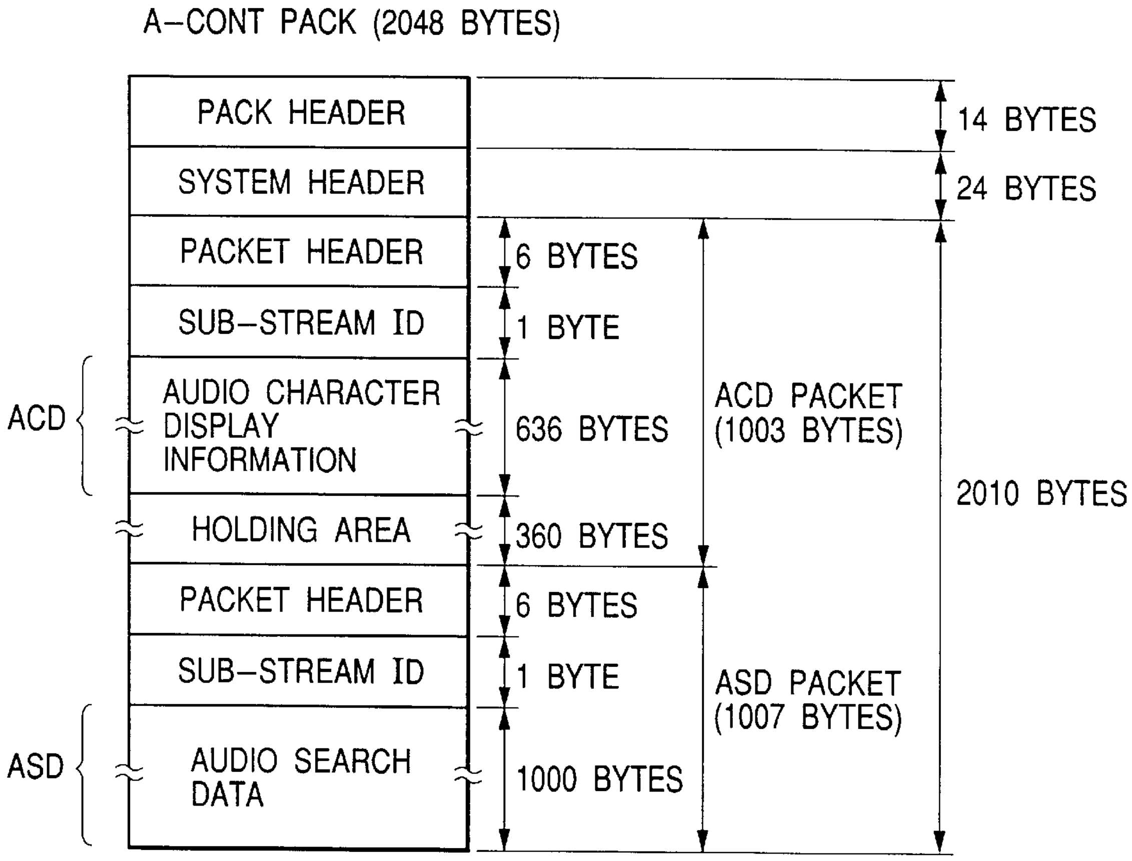
FIG. 8 shows a data format of an audio control pack of the DVD-audio format.
Figure 9:
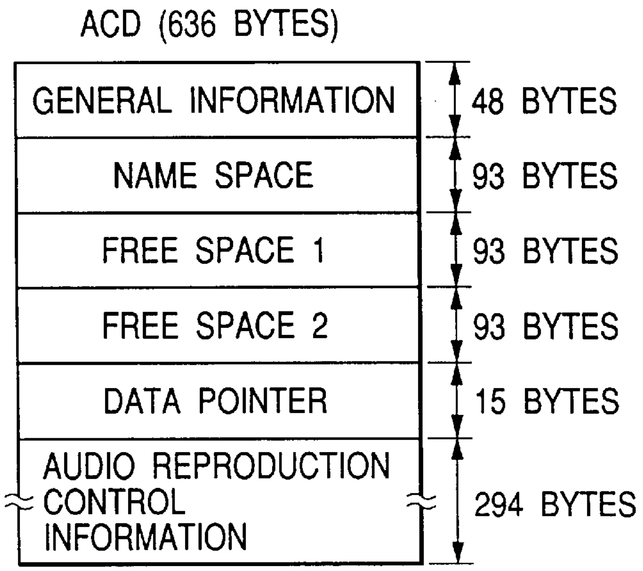
FIG. 9 shows a data format of an area of audio character display information arranged in the audio control pack shown in FIG. 8.
Figure 10:
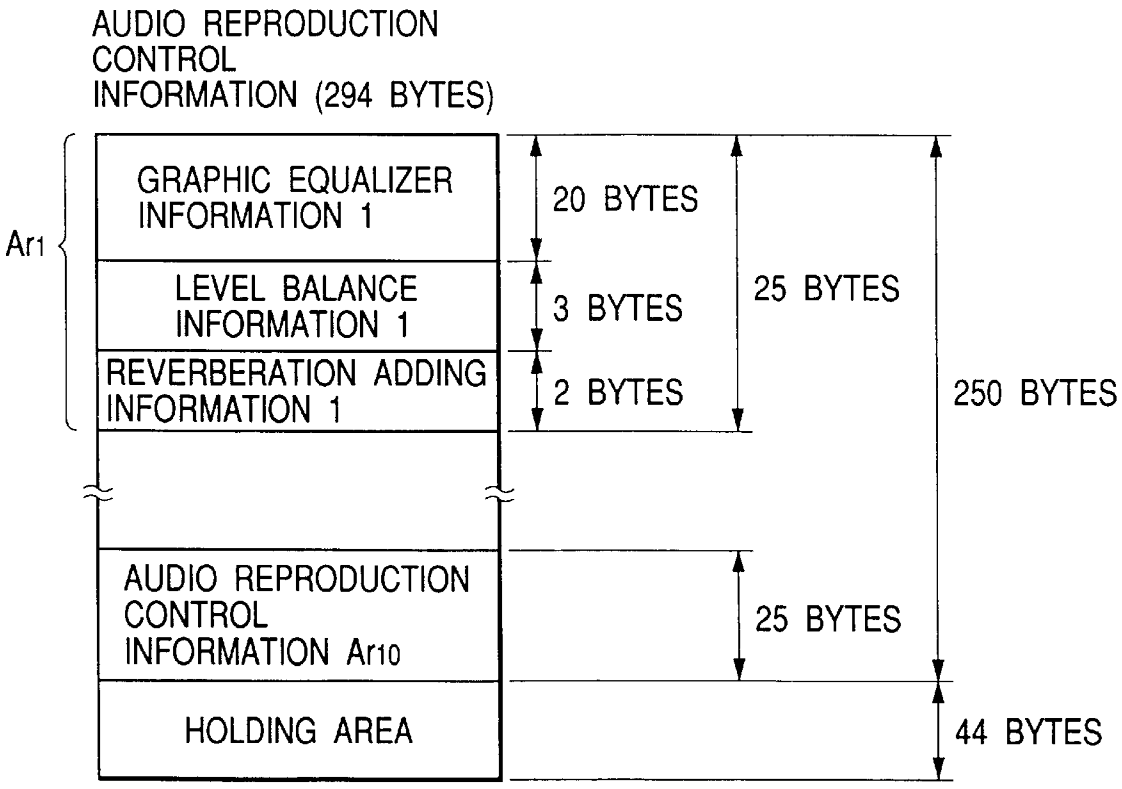
FIG. 10 shows a data format of an area of audio reproduction control information arranged in the audio character display information shown in FIG. 9, according to the first embodiment.

Also, as shown in FIG. 8, a back header of 14 bytes, a system header of 24 bytes, an audio character display (ACD) packet of 1003 bytes and an audio search data (ASD) packet of 1007 bytes are arranged in that order in each A-CONT pack. Also, a packet header of 6 bytes, sub-stream identification data of 1 byte, audio character display (ACD) information of 636 bytes and a holding area of 360 bytes are arranged in that order in each ACD packet. The configuration of the ACD information is shown in FIG. 9, and the configuration of audio reproduction control information included in the ACD information is shown in FIG. 10. Also, the ASD packet is composed of a packet header of 6 bytes, sub-stream identification data of 1 byte and audio search data (ASD) of 1000 bytes arranged in that order. The configuration of the ASD is shown in FIG. 11.

As shown in FIG. 9, an area of the ACD information is composed of an area of general information of 48 bytes, an area of a name space of 93 bytes, two areas of two free spaces respectively having 93 bytes, an area of a data pointer of 15 bytes and an area of audio reproduction control information of 294 bytes. As shown in FIG. 10, the area of the audio reproduction control information is composed of areas of ten pieces of audio reproduction control information Ar1 to Ar10 (respectively denoting sound quality control data) respectively having 25 bytes and a holding area of 44 bytes, and each piece of audio reproduction control information Ari is composed of graphic equalizer information of 20 bytes, level balance information of 3 bytes and reverberation adding information of 2 bytes. These pieces of audio reproduction control information Ar1 to Ar10 are recommended by professional mixers and are determined so as to make a sound quality of an audio signal in a reproduction operation set to a best condition according to a category (for example, classic, jazz, rock or background music) of a music of the audio signal, a playing condition of the music, a recording condition of the audio signal or circumstances of a reproducing condition in cases where the music of the audio signal arranged in the audio packs is reproduced.

Figures 11, 12:
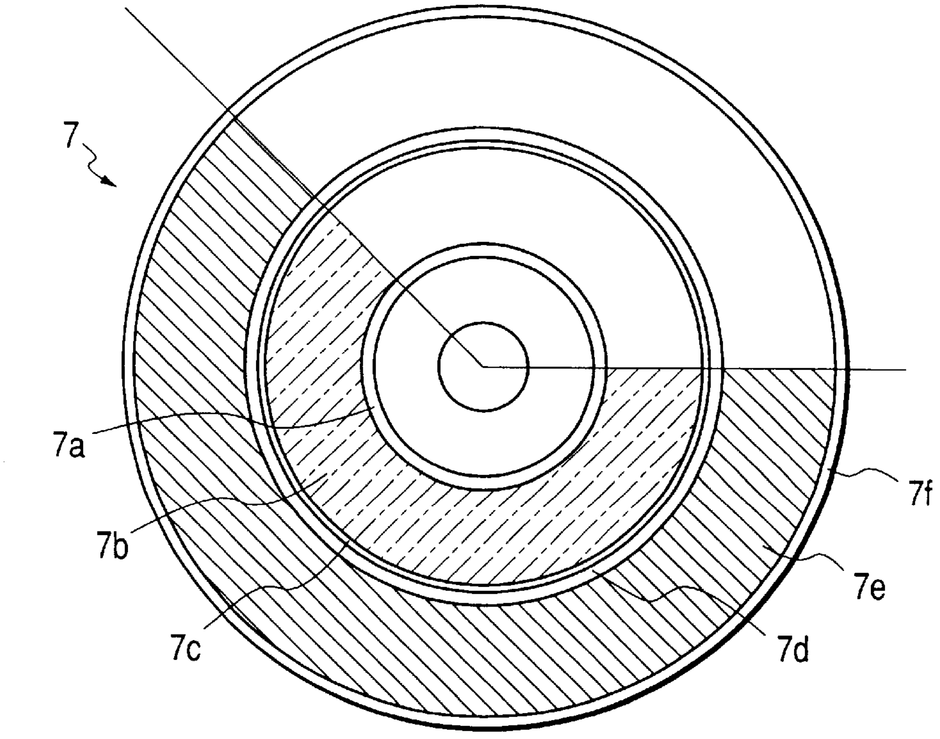
FIG. 11 shows a data format of an area of audio search data arranged in the audio control pack shown in FIG. 8.
FIG. 12 shows a plurality of areas existing in a DVD-audio disk in which data arranged in the DVD-audio format and data arranged in the DVD-video format are recorded.

As shown in FIG. 11, the audio search data (ASD) is composed of general information of 16 bytes, current music identifying number information of 8 bytes, current date and time information of 16 bytes, album set search information of 8 bytes, album search information of 8 bytes, track search information of 404 bytes, index search information of 408 bytes, highlight search information of 80 bytes and a holding area of 52 bytes.

Eight-to-fourteen modulation (EFM) is performed for each piece of packed data arranged in the DVD-audio format (or the DVD-video format) in the modulating circuit 35 to produce a modulated signal for each piece of packed data, the modulated signal is recorded in a master disk as disk data, and the disk data of the master disk is transferred to a DVD-audio disk 7 shown in FIG. 12. As shown in FIG. 12, the DVD-audio disk 7 generally has a diameter of 12 cm or a small sized DVD-audio disk has a diameter ranging from 4 cm to 6 cm, and the DVD-audio disk 7 has a first lead-in area 7*a*, a first data area 7*b*, a first lead-out area 7*c*, a second lead-in area 7*d*, a second data area 7*e* and a second lead-out area 7*f* arranged from an inner side to an outer side.

Accordingly, the series of user data produced from the analog audio signal indicating a music can be packed with sound quality control data indicating various types of audio reproduction control information to produce the packed data, and the packed data can be recorded in a recording medium such as DVD. Therefore, in cases where a user selects one piece of audio reproduction control information when the music is reproduced, the user can entertain the music set to a user's desired sound quality.

Next, an audio signal reproducing apparatus for reproducing an analog audio signal from the packed data recorded in the DVD-audio disk 7 as the modulated signal is described with reference to FIG. 13.

Figure 13:
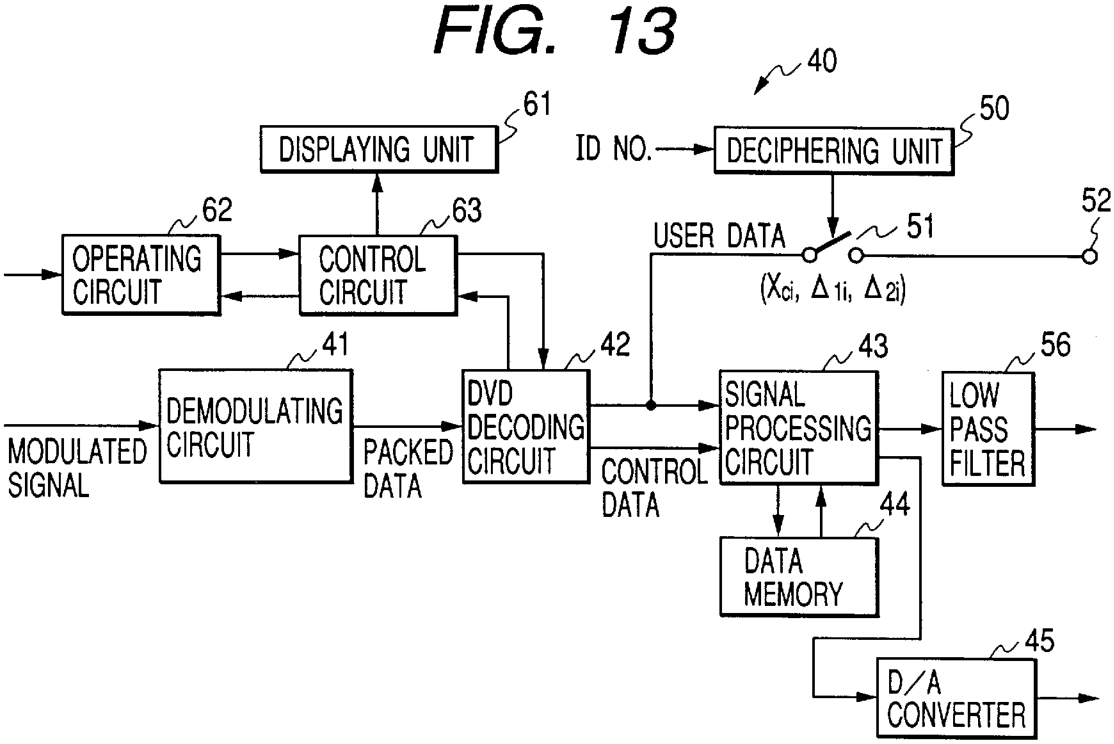
FIG. 13 is a block diagram of an audio signal reproducing apparatus according to the first embodiment.

FIG. 13 is a block diagram of an audio signal reproducing apparatus according to the first embodiment.

As shown in FIG. 13, an audio signal reproducing apparatus 40 comprises

- a demodulating circuit 41 for demodulating the modulated signal recorded in the DVD-audio disk 7 according to a demodulating method corresponding to the modulating method performed in the modulating circuit 35 to reproduce packed data;
- a DVD decoding circuit 42 for decoding the packed data to a plurality of series of user data of audio packs and pieces of control data of one audio-control pack and outputting a data decoding signal indicating the decoding of the packed data, the pieces of audio reproduction control information Ar1 to Ar10 being included in the control data;
- a displaying unit 61 for displaying an image requesting the user to select one of the pieces of audio reproduction control information Ar1 to Ar10 according to the data decoding signal received from the DVD decoding circuit 42;
- an operating unit 62 for receiving a data selection instruction of the user indicating the selection of one piece of particular audio reproduction control information displayed on the displaying unit 61;
- a control circuit 63 for controlling the displaying unit 61 according to the data decoding signal received from the DVD decoding circuit 42 and outputting a selection signal indicating one piece of particular audio reproduction control information selected by the data selection instruction to the DVD decoding circuit 42, the particular audio reproduction control information being output from the DVD decoding circuit 42 according to the selection signal;
- a signal processing circuit 43 for reproducing the PCM digital audio signal from the series of user data for each channel and changing levels of the pieces of PCM audio data of the PCM digital audio signal according to the particular audio reproduction control information transmitted from the DVD decoding circuit 42 to appropriately adjust a sound quality of a music indicated by the PCM digital audio signal to a user's desired sound quality and producing a sound quality adjusted PCM digital audio signal for each channel;
- a data memory 44 for temporarily storing the series of user data, the series of band limited audio data, the series of sampling frequency reduced data, the series of thinned-out audio data and the series of differential audio data produced in the signal processing circuit 43;
- a digital-analog (D/A) converter 45 for converting the sound quality adjusted PCM digital audio signal to a sound quality adjusted analog audio signal for each channel;
- a low pass filter 56 for limiting a frequency band of the sound quality adjusted PCM digital audio signal and outputting a band limited PCM digital audio signal; and
- a deciphering unit 50 for receiving a personal identification number input by the user as a cipher, judging whether or not the personal identification number is correct and setting a switch 51 to an on-condition to output the series of user data obtained in the DVD decoding circuit 42 through the switch 51 for each channel.

In the above configuration of the audio signal reproducing apparatus 40, the modulated signal recorded in the DVD-audio disk 7 is read out by a DVD-audio drive apparatus (not shown) and is demodulated in the demodulating circuit 35 according to a demodulating method corresponding to the modulating method performed in the modulating circuit 35, so that the packed data is obtained. Thereafter, the packed data is decoded in the DVD decoding circuit 42, so that the series of user data {Xci, Δ1i, Δ2i} of each audio pack and the control data of each audio-control pack are obtained.

Thereafter, a data decoding signal indicating the decoding of the packed data is transmitted from the DVD decoding circuit 42 to the control circuit 63, and an image requesting a user to select one of the pieces of audio reproduction control information Ar1 to Ar10 of the ACD information arranged in the audio-CONT pack is displayed in the displaying unit 61 under the control of the control circuit 63. Each piece of audio reproduction control information indicates a particular sound quality for a reproduced music. Therefore, in cases where the user inputs the selection of one piece of particular audio reproduction control information to the operating unit 62 when the reproduction of a music indicated by the analog audio signal is started or in the middle of the reproduction of the music, a selection signal indicating the particular audio reproduction control information is transmitted from the control circuit 63 to the DVD decoding circuit 42. Thereafter, the series of user data {Xci, Δ1i, Δ2i} and the control data including the particular audio reproduction control information as sound quality control data are transmitted from the DVD encoding circuit 42 to the signal processing circuit 43.

Figure 14A:
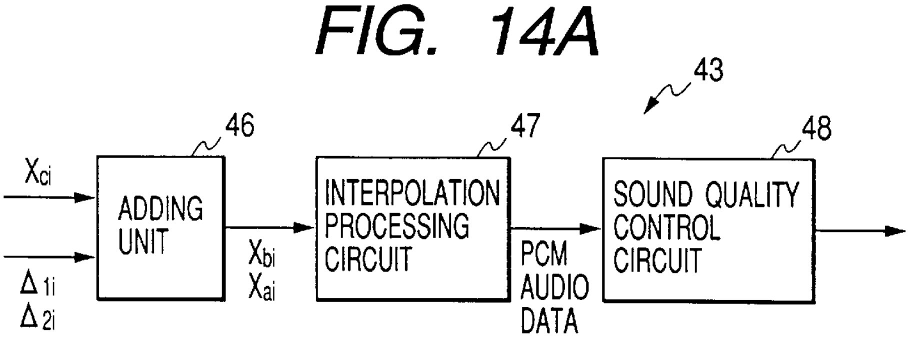
FIG. 14A is a block diagram of a signal processing circuit of the audio signal reproducing apparatus shown in FIG. 13.
Figure 15:
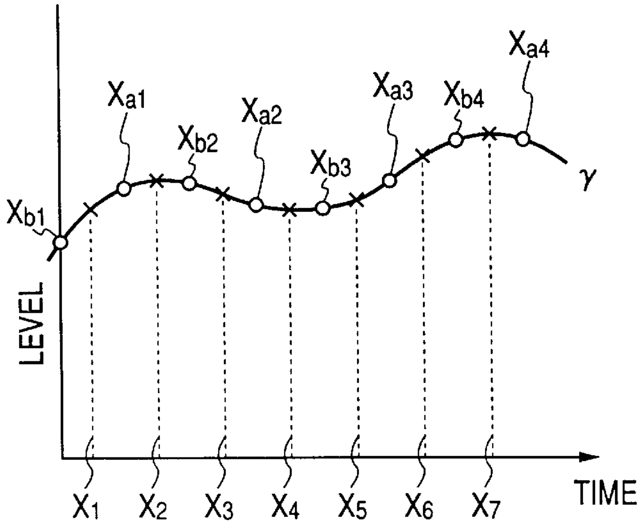
FIG. 15 shows the series of PCM audio data reproduced in an interpolation processing circuit of the signal processing circuit shown in FIG. 14A.

FIG. 14A is a block diagram of the signal processing circuit 43. As shown in FIG. 14A, the series of sampling frequency reduced data {Xci} and the series of differential audio data {Δ1i} are add together in an adding unit 46 to reproduce the series of data {Xbi} according to an equation $\Delta 1i+Xci=Xbi$. Also, the series of sampling frequency reduced data {Xci} and the series of differential audio data {Δ2i} are add together in the adding unit 46 to reproduce the series of data {Xai} according to an equation $\Delta 2i+Xci=Xai$. Therefore, the series of thinned-out audio data {Xbi,Xai} is reproduced. Here, each piece of data in the series of thinned-out audio data {Xbi,Xai} is expressed by 24 bits. Thereafter, as shown in FIG. 15, a series of interpolation data {Xi} is interpolated into the series of thinned-out audio data {Xbi, Xai} arranged along a curved line γ in an interpolation processing circuit 47. For example, an up-sampling method is performed for the series of thinned-out audio data {Xbi, Xai} arranged along a curved line in the interpolation processing circuit 47. That is, data "0" is initially applied for each piece of data Xi, the series of interpolation data {Xi} and the series of thinned-out audio data {Xbi,Xai} are repeatedly supplied to a low pass filter, so that the series of interpolation data {Xi} arranged along the curved line can be obtained. Also, it is applicable that the series of interpolation data {Xi} be obtained according to a curve-fitting method or a predictive approximation method. In this case, an approximation degree of the series of interpolation data {Xi} for the series of thinned-out audio data {Xbi,Xai} can be heightened by adding pieces of approximated supplementary data. Thereafter, the series of interpolation data {Xi} are arranged in the series of thinned-out audio data {Xbi,Xai} to produce a data series (Xb1, X1, Xa1, X2, Xb2, X3, Xa2, - - - , Xbi, X2i−1, Xai, X2i, - - - ), so that the series of PCM audio data {Xbi, X2i−1, Xai, X2i} is reproduced in the interpolation processing circuit 47. Thereafter, the series of PCM audio data {Xbi, X2i−1, Xai, X2i} is transmitted to a sound quality control unit 48.

Figure 14B:
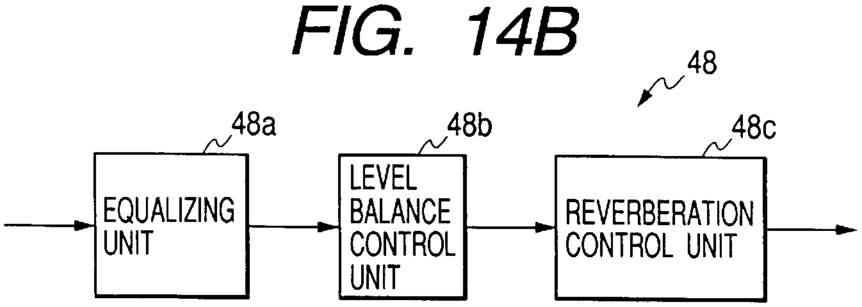
FIG. 14B is a block diagram of a sound quality control circuit of the signal processing circuit shown in FIG. 14A.

FIG. 14B is a block diagram of the sound quality control unit 48. As shown in FIG. 14B, the sound quality control unit 48 comprises an equalizing unit 48*a*, a level balance control unit 48*b* and a reverberation control unit 48*c*. In the equalizing unit 48*a*, the original levels of the pieces of PCM audio data are changed according to the graphic equalizer information included in the selected piece of audio reproduction control information for each frequency band. In the level balance control unit 48*b*, levels of the pieces of PCM audio data are changed according to the level balance information included in the selected pieces of audio reproduction control information for each channel. In the reverberation control unit 48*c*, reverberation is added to the PCM digital audio signal according to the reverberation adding information included in the selected piece of audio reproduction control information for each channel. Therefore, the levels of the pieces of PCM audio data are changed to set a sound quality of a music indicated by the analog audio signal to a user's desired sound quality, and a sound quality adjusted PCM digital audio signal is produced in the sound quality control unit 48.

Thereafter, the sound quality adjusted PCM digital audio signal is converted into a sound quality adjusted analog audio signal in the digital-analog converter 45 for each channel, and the sound quality adjusted analog audio signal is output through an analog output terminal 55. Also, a frequency band of the sound quality adjusted PCM digital audio signal is band-limited to ¼ frequency band in the low pass filter 56, and a band-limited PCM digital audio signal is output through a digital output terminal 53.

Also, in the deciphering unit 50, a personal identification number input by the user is received as a cipher, and it is judged whether or not the personal identification number is correct. In cases where it is judged that the personal identification number is correct, the switch 51 is set to an on-condition, so that the series of user data {Xci, Δ1i, Δ2i} obtained in the DVD decoding circuit 42 is output through a digital output terminal 52 for each channel.

Accordingly, because the packed data recorded in a DVD-audio disk is composed of the series of user data produced from the analog audio signal indicating a music and sound quality control data indicating various types of audio reproduction control information, in cases where the user selects one piece of audio reproduction control information when the music is reproduced, the user can entertain the music set to a user's desired sound quality.

Next, a second embodiment relating to a level shift is described.

Figure 16:
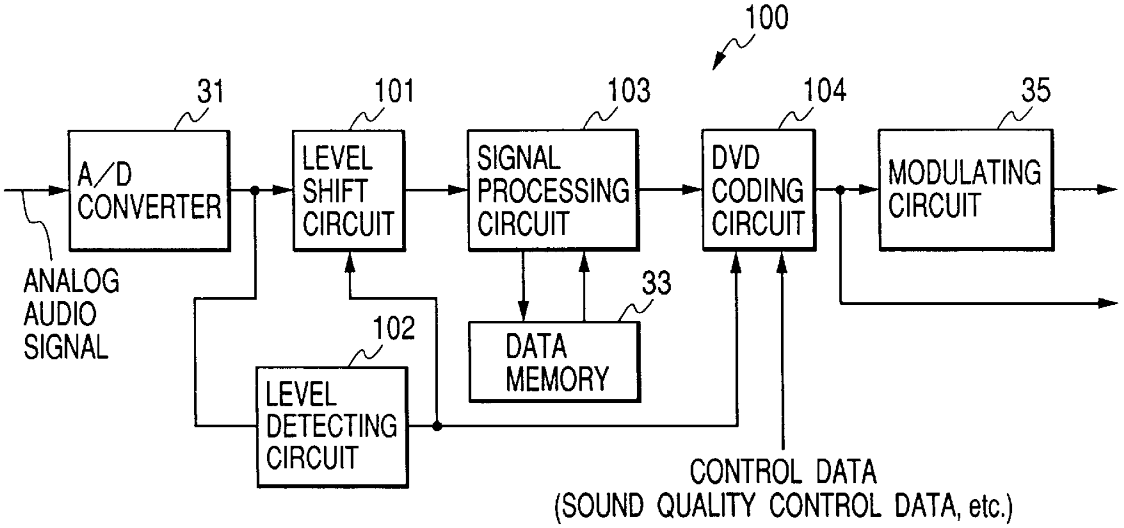
FIG. 16 is a block diagram of an audio signal processing apparatus used for performing an audio signal processing and reproducing method according to a second embodiment.

FIG. 16 is a block diagram of an audio signal processing apparatus used for performing an audio signal reproducing method according to a second embodiment.

As shown in FIG. 16, an audio signal processing apparatus 100 comprises:

the analog-digital (A/D) converter 31;

a level detecting circuit 102 for detecting a highest value among values of the pieces of PCM audio data as a maximum level of the PCM digital audio signal for each channel, detecting a particular maximum level highest among the maximum levels of the PCM digital audio signals of the channels and producing level shift control data according to the particular maximum level;

a level shift circuit 101 for shifting original levels of the pieces of PCM audio data of the PCM digital audio signal by a particular differential level (expressed by dB unit) determined according to the level shift control data for each channel and reducing the number of codes expressing each piece of PCM audio data by a particular number to compress each piece of PCM audio data to a piece of level-shifted PCM audio data, a level-shifted PCM digital audio signal composed of pieces of level-shifted PCM audio data being produced for each channel;

a signal processing circuit 103 for processing the level-shifted PCM digital audio signal by producing a band limited digital audio signal composed of a series of band limited audio data from the level-shifted PCM digital audio signal for each channel, producing a sampling frequency reduced signal composed of a series of sampling frequency reduced data from the band limited digital audio signal for each channel, producing a thinned-out audio signal composed of a series of thinned-out audio data from the PCM digital audio signal for each channel and producing a differential audio signal composed of a series of differential audio data from the thinned-out audio signal and the sampling frequency reduced signal for each channel and producing a series of user data composed of one series of sampling frequency reduced data and one series of differential audio data for each channel;

the data memory 33 for temporarily storing the series of level-shifted PCM audio data, the series of band limited audio data, the series of sampling frequency reduced data, the series of thinned-out audio data and the series of differential audio data produced in the signal processing circuit 103;

a DVD encoding circuit 104 for encoding and packing a plurality of series of user data, the level shift control data and other control data including sound quality control data to produce packed data for each channel; and the modulating circuit 35.

In the above configuration, an operation of the audio signal processing apparatus 100 is described.

After one PCM digital audio signal is produced from an analog audio signal for each channel in the A/D converter 31 in the same manner as in the first embodiment, the PCM digital audio signals of the channels are transmitted to the level shift circuit 101 and the level detecting circuit 102.

Figure 17A:
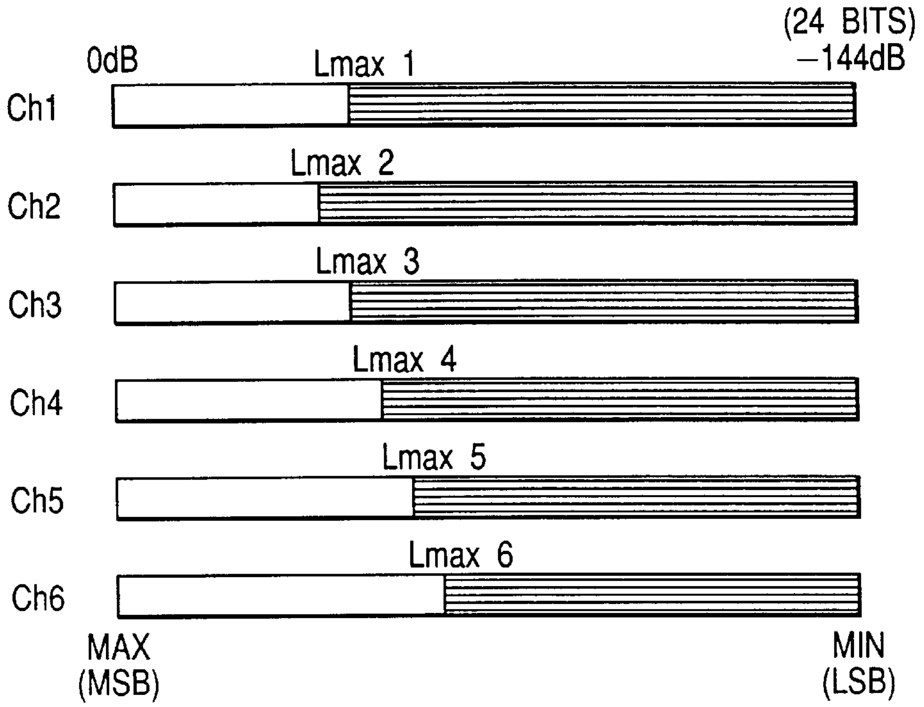
FIG. 17A shows a level range from 0 dB (an upper limit level) to −144 dB (a lower limit level) expressed by 24 bits and a maximum level of a PCM digital audio signal denoting a highest value among values of the pieces of PCM audio data of the PCM digital audio signal for each channel.

FIG. 17A shows a level range from 0 dB (an upper limit level) to −144 dB (a lower limit level) expressed by 24 bits and a maximum level of one PCM digital audio signal denoting a highest value among values of the pieces of PCM audio data of the PCM digital audio signal for each channel.

As shown in FIG. 17A, maximum levels of the PCM digital audio signals at the channels Ch1 to Ch6 are indicated by Lmax1 to Lmax6, and a relationship $$Lmax2>Lmax1=Lmax3>Lmax4>Lmax5>Lmax6$$

is, for example, satisfied in this embodiment.

Figure 17B:
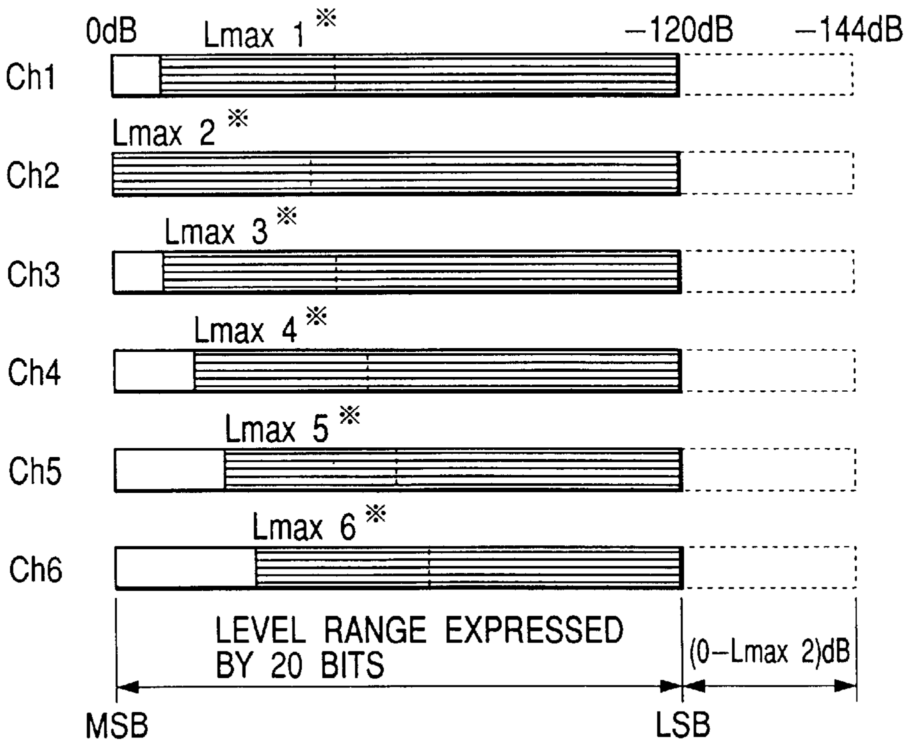
FIG. 17B shows a level range from 0 dB to −120 dB expressed by 20 bits and a maximum level of a level-shifted PCM digital audio signal denoting a highest value among values of the pieces of level-shifted PCM audio data of the level-shifted PCM digital audio signal for each channel on condition that the maximum levels of the channels are shifted by a differential level to heighten the maximum level Lmax2 highest among the maximum levels of the channels to 0 dB.

When a particular maximum level Lmax2 of the channel Ch2 highest among the maximum levels Lmax1 to Lmax6 is detected in the level detecting circuit 102, level shift control data indicating a differential level (0−Lmax2) is transmitted to the level shift circuit 101 and the DVD encoding circuit 104. In the level shift circuit 101, original levels (or original values) of the pieces of PCM audio data of the PCM digital audio signal are heightened by the differential level (0−Lmax2) according to the level shift control data for each channel, and the pieces of PCM audio data respectively expressed by 24 bits are compressed to produce pieces of level-shifted PCM audio data respectively expressed by 20 bits for each channel. Therefore, as shown in FIG. 17B, the maximum levels Lmax1 to Lmax6 of the PCM digital audio signals are shifted to maximum levels Lmax1* to Lmax6* of the level-shifted PCM digital audio signals, and the particular maximum level Lmax2 of the channel Ch2 is heightened to a maximum value (Lmax2*=0 dB) expressed by 20 bits.

Figure 18:
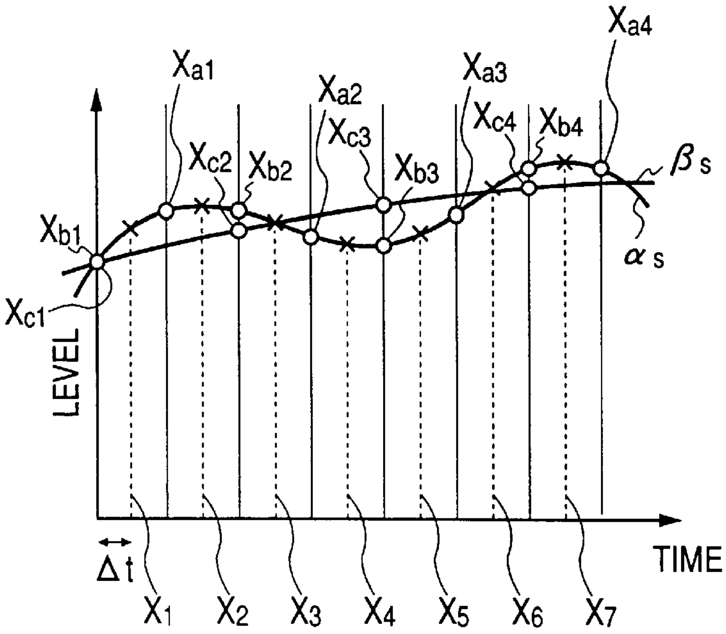
FIG. 18 shows a series of level-shifted PCM audio data sampled at a sampling frequency (a curved line $\alpha_s$) and a series of band limited audio data (a curved line $\beta_s$)

Thereafter, the series of level-shifted PCM audio data of each channel is transmitted to the signal processing circuit 103. In this case, as shown in FIG. 18, the PCM digital audio signal of each channel is indicated by a series of level-shifted PCM audio data (Xb1, X1, Xa1, X2, Xb2, X3, Xa2, - - - , Xbi, X2i−1, Xai, X2i, - - - ) arranged along a curved line $\alpha_s$. Thereafter, the series of level-shifted PCM audio data {Xbi, X2i−1, Xai, X2i} is encoded in the signal processing circuit 103, and a series of user data is produced for each channel.

Figure 19:
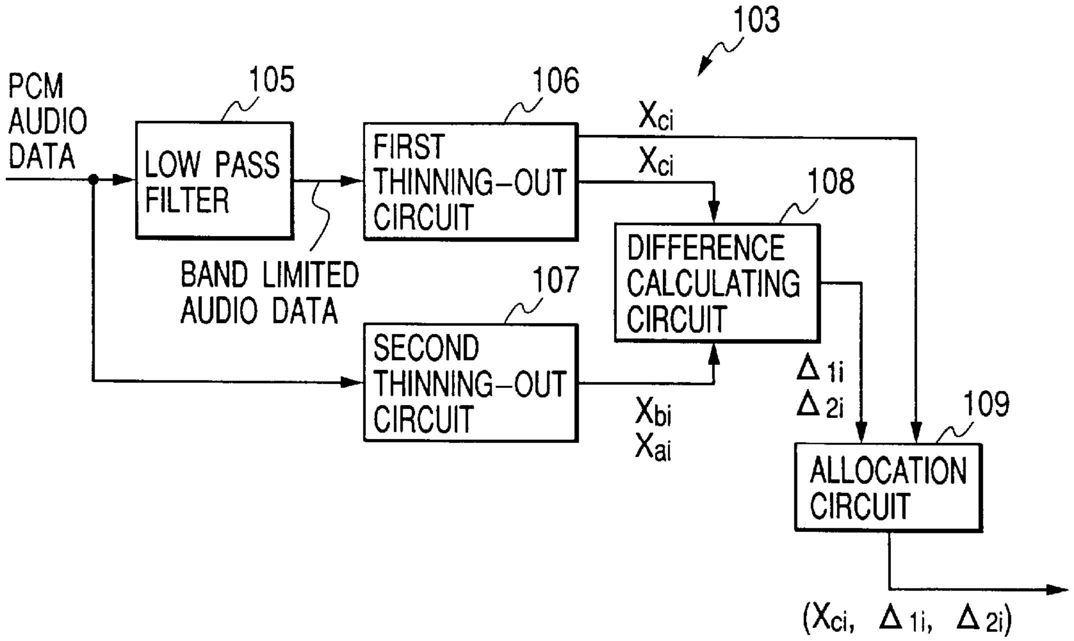
FIG. 19 is a block diagram of a signal processing circuit of the audio signal processing apparatus shown in FIG. 16.
Figure 20:
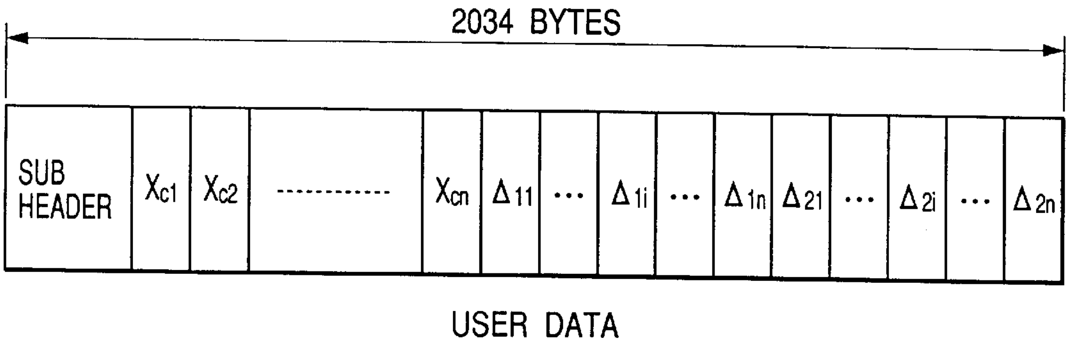
FIG. 20 shows a series of user data produced in an allocation circuit of the signal processing circuit shown in FIG. 19.

FIG. 19 is a block diagram of the signal processing circuit 103.

As shown in FIG. 19, a frequency band of the series of level-shifted PCM audio data {Xbi, X2i−1, Xai, X2i} is limited to half in a low pass filter 105 such as a finite-duration impulse-response (FIR) filter. Therefore, as shown in FIG. 18, a series of band limited audio data (Xc1, *, *, *, Xc2, *, *, *, Xc3, *, *, *, - - - , Xci, *, *,*, - - - ) arranged along a curved line $\beta_s$ is produced as a band limited digital audio signal from the series of level-shifted PCM audio data {Xbi, X2i−1, Xai, X2i} for each channel. Here, the symbol "*" denotes one piece of band limited audio data. Thereafter, in a first thinning-out circuit 106, the pieces of band limited audio data "*" are removed from the series of band limited audio data, and a series of sampling frequency reduced data (Xc1, Xc2, Xc3, - - - , Xci, - - - ) is produced as a sampling frequency reduced signal from the series of band limited audio data for each channel. The series of sampling frequency reduced data {Xci} denotes a data series obtained by band-limiting the series of level-shifted PCM audio data {Xbi, X2i−1, Xai, X2i} and reducing the sampling frequency (192 kHz) to ¼. Also, in a second thinning-out circuit 107, the pieces of data Xi are removed from the level-shifted PCM audio data, and a series of thinned-out audio data (Xb1, Xa1, Xb2, Xa2, - - - , Xbi, Xai, - - - ) is produced as a thinned-out audio signal from the level-shifted PCM audio data for each channel.

Thereafter, in a difference calculating circuit 108 composed of an adder, a difference Δ1i=Xbi−Xci and a difference Δ2i=Xai−Xci are calculated, so that a series of differential audio data {Δ1i} and a series of differential audio data {Δ2i} are produced from the series of sampling frequency reduced data {Xci} and the series of thinned-out audio data {Xbi,Xai} for each channel. The differential audio data Δ1i and Δ2i can be respectively expressed by 20 bits or less, so that the number of bits expressing each piece of differential data is fixed to 20 or is variable.

Thereafter, in an allocation circuit 109, the series of sampling frequency reduced data {Xci}, the series of differential audio data {Δ1i} and the series of differential audio data {Δ2i} are packed to produce a series of user data {Xci, Δ1i, Δ2i} for each channel. In this case, as shown in FIG. 5, when the series of user data is recorded in a DVD, because one series of user data {Xci, Δ1i, Δ2i} including a sub-header expressed by 9 bytes is expressed by 2034 bytes, the number of sampling frequency reduced data Xci, the number of differential audio data Δ1i and the number of differential audio data Δ2i are respectively 225 in one series of user data {Xci, Δ1i, Δ2i}.

Thereafter, as shown in FIG. 16, in the DVD encoding circuit 104, the level shift control data, other pieces of control data described later and the series of user data are packed to packed data. Thereafter, in the modulating circuit 35, the packed data of each channel is modulated to a modulated signal according to a modulation type depending on a recording medium such as DVD. Thereafter, the modulated signal is recorded in the recording medium or is transmitted to another apparatus through a transmission line.

Also, packed data relating to a video signal is produced in the same manner for each channel.

Next, a DVD-audio format used for each piece of packed data to record each modulated signal in a DVD is described.

The packed data for a video signal is recorded on a DVD in a DVD-video format shown in FIGS. 5A, 6 and 7 in the same manner as in the first embodiment, and the packed data for an audio signal is recorded on a DVD in a DVD-audio format shown in FIGS. 5B, 6, 7, 8, 9, 11 and 21.

The DVD-audio format according to the second embodiment differs from that according to the first embodiment in the audio reproduction control information included in the ACD information.

Figure 21:
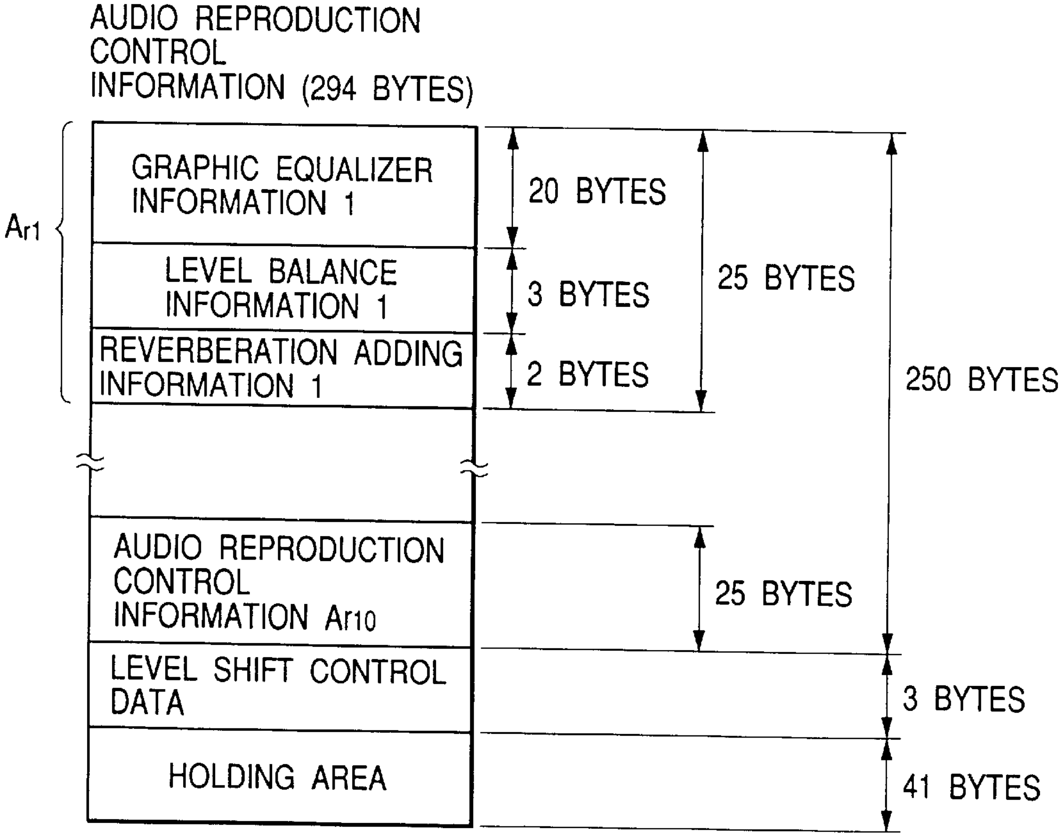
FIG. 21 shows a data format of an area of audio reproduction control information arranged in the audio character display information shown in FIG. 9, according to the second embodiment.

FIG. 21 shows the configuration of audio reproduction control information included in the ACD information according to the second embodiment.

As shown in FIG. 21, the area of the audio reproduction control information is composed of areas of ten pieces of audio reproduction control information Ar1 to Ar10 (corresponding to sound quality control data) respectively having 25 bytes, an area of the level shift control data of 3 bytes produced in the level detecting circuit 102 of the audio signal processing apparatus 100 and a holding area of 41 bytes. The configuration of each piece of audio reproduction control information Ari is the same as that in the first embodiment.

Accordingly, because original levels of the pieces of PCM audio data obtained from an analog audio signal indicating a music are changed by a particular differential level to shift the original levels to shifted levels, the number of codes required to express each piece of PCM audio data can be reduced. Also, because the pieces of level-shifted PCM audio data having the shifted levels are recorded with the level shift control data indicating the differential level, when the music is reproduced, the pieces of level-shifted PCM audio data can be easily returned to the pieces of PCM audio data with accuracy according to the level shift control data.

Next, an audio signal reproducing apparatus for decoding the packed data recorded in the DVD-audio disk 7 as the modulated signal according to the second embodiment is described with reference to FIG. 22.

Figure 22:
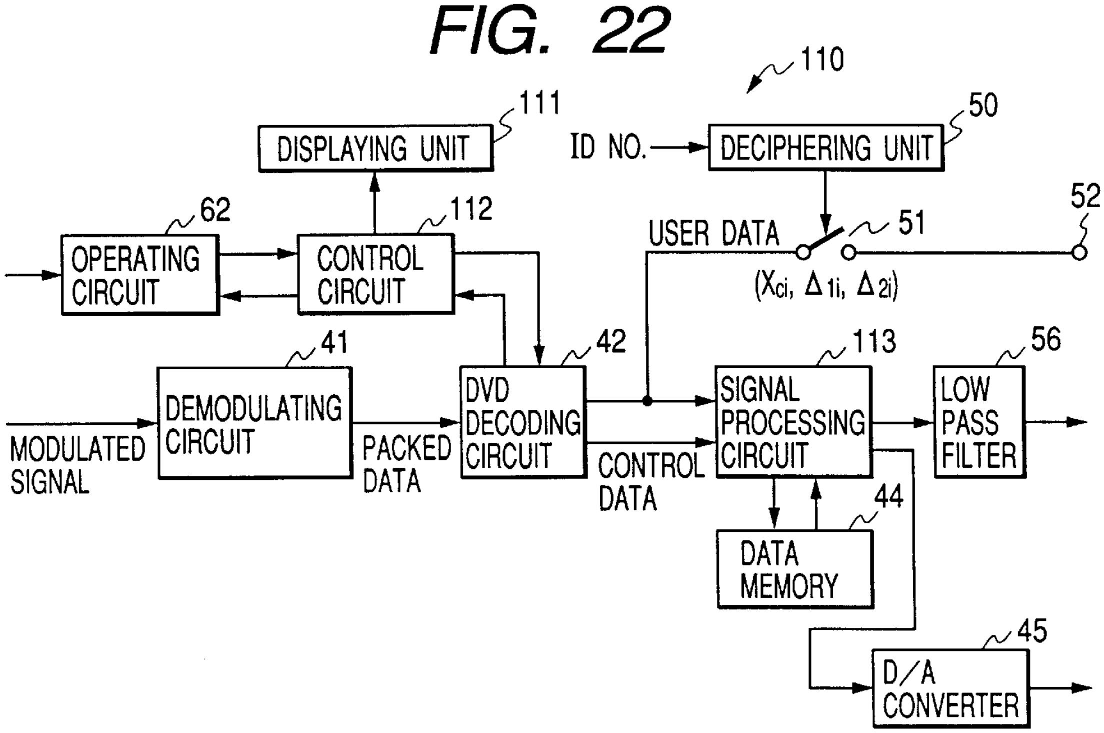
FIG. 22 is a block diagram of an audio signal reproducing apparatus according to the second embodiment.

FIG. 22 is a block diagram of an audio signal reproducing apparatus according to the second embodiment.

As shown in FIG. 22, an audio signal reproducing apparatus 110 comprises the demodulating circuit 41 for demodulating the modulated signal recorded in the DVD-audio disk 7 according to a demodulating method corresponding to the modulating method performed in the modulating circuit 35 of the audio signal processing apparatus 100 to reproduce the packed data for each channel;

the DVD decoding circuit 42 for decoding each piece of packed data to the series of user data of each audio pack and the control data of each audio-control pack and outputting a data decoding signal indicating the decoding of the packed data, the pieces of audio reproduction control information Ar1 to Ar10 and the level shift control data being included in the control data;

a displaying unit 111 for displaying an image requesting a user to judge whether or not the return of the shifted levels of the pieces of level-shifted PCM audio data to the original levels is performed and displaying an image requesting the user to select one of the pieces of audio reproduction control information Ar1 to Ar10;

the operating unit 62 for receiving a level control instruction indicating the return of the shifted levels of the pieces of level-shifted PCM audio data to the original levels and receiving a data selection instruction indicating the selection of a piece of particular audio reproduction control information displayed on the displaying unit 111;

a control unit 112 for controlling the operation of the displaying unit 111 and the operating unit 62 according to the data decoding signal transmitted from the DVD decoding circuit 42 and transmitting the level control instruction and a selection signal to the DVD decoding circuit 42;

a signal processing circuit 113 for reproducing the pieces of level-shifted PCM audio data from the series of user data for each channel, changing the shifted levels of the pieces of level-shifted PCM audio data by a differential level indicated by the level shift control data of the control data according to the level control instruction transmitted from the DVD decoding circuit 42 to reproduce the series of PCM audio data having the original levels for each channel and adjusting a sound quality of a music indicated by the PCM digital audio signal according to the piece of particular audio reproduction control information transmitted from the DVD decoding circuit 42 to produce a sound quality adjusted PCM digital audio signal composed of pieces of sound quality adjusted PCM audio data for each channel;

the data memory 44 for temporarily storing the series of band limited audio data, the series of sampling frequency reduced data, the series of thinned-out audio data and the series of differential audio data produced in the signal processing circuit 113;

the digital-analog converter 45; the low pass filter 56; and the deciphering unit 50.

In the above configuration of the audio signal reproducing apparatus 110, the packed data is obtained in the demodulating circuit 35, and the series of user data {Xci, Δ1i, Δ2i} and the control data are obtained from the packed data in the DVD decoding circuit 42. Thereafter, a data decoding signal indicating the decoding of the packed data is transmitted from the DVD decoding circuit 42 to the control circuit 112. Therefore, an image requesting a user to judge whether or not the return of the shifted levels of the pieces of level-shifted PCM audio data to the original levels is performed is displayed in the displaying unit 111 under the control of the control circuit 112. Therefore, when the user inputs a level instruction to the operating unit 62 to instruct the audio signal reproducing apparatus 110 to perform the return of the shifted levels of the pieces of level-shifted PCM audio data to the original levels, a level control signal indicating the return of the shifted levels of the pieces of level-shifted PCM audio data to the original levels is transmitted from the control unit 112 to the DVD decoding circuit. Also, a selection signal indicating the user's selection of a piece of particular audio reproduction control information is transmitted from the control unit 112 to the DVD decoding circuit in the same manner as in the first embodiment.

Thereafter, the series of user data {Xci, Δ1i, Δ2i} and the control data including the level shift control data and the particular audio reproduction control information are transmitted from the DVD encoding circuit 42 to the signal processing circuit 113.

Figure 23A:
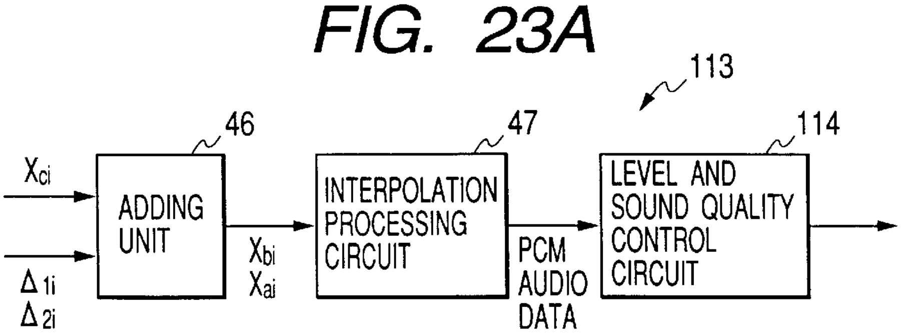
FIG. 23A is a block diagram of a signal processing circuit of the audio signal reproducing apparatus shown in FIG. 22.
Figure 24:
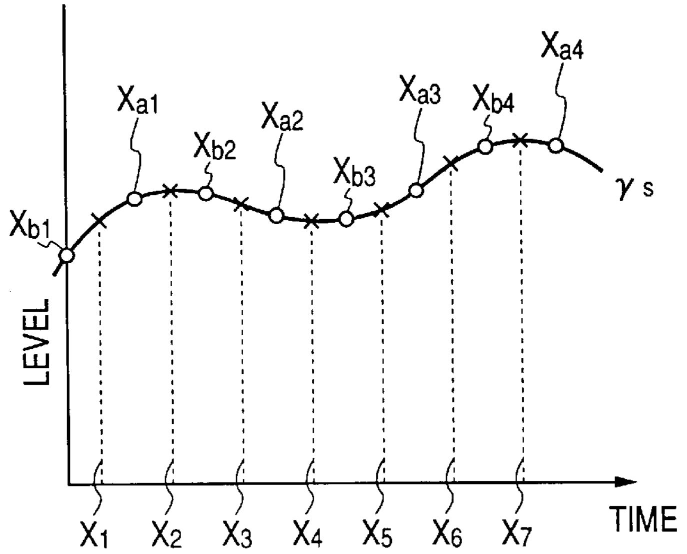
FIG. 24 shows the series of level-shifted PCM audio data reproduced in an interpolation processing circuit of the signal processing circuit shown in FIG. 23A.

FIG. 23A is a block diagram of the signal processing circuit 113. As shown in FIG. 23A, the series of sampling frequency reduced data {Xci} and the series of differential audio data {Δ1i} are add together in the adding unit 46 to reproduce the series of data {Xbi} according to an equation Δ1i+Xci=Xbi. Also, the series of sampling frequency reduced data {Xci} and the series of differential audio data {Δ2i} are add together in the adding unit 46 to reproduce the series of data {Xai} according to an equation Δ2i+Xci=Xai. Therefore, the series of thinned-out audio data {Xbi,Xai} is reproduced. Here, each piece of data in the series of thinned-out audio data {Xbi,Xai} is expressed by 20 bits. Thereafter, as shown in FIG. 24, a series of interpolation data {Xi} is interpolated into the series of thinned-out audio data {Xbi, Xai} arranged along a curved line $\gamma_s$ in the interpolation processing circuit 47. Thereafter, the series of interpolation data {Xi} are arranged in the series of thinned-out audio data {Xbi,Xai} to produce a data series (Xb1, X1, Xa1, X2, Xb2, X3, Xa2, - - - , Xbi, X2i−1, Xai, X2i, - - - ), so that the series of level-shifted PCM audio data {Xbi, X2i−1, Xai, X2i} is reproduced in the interpolation processing circuit 47.

Figure 23B:
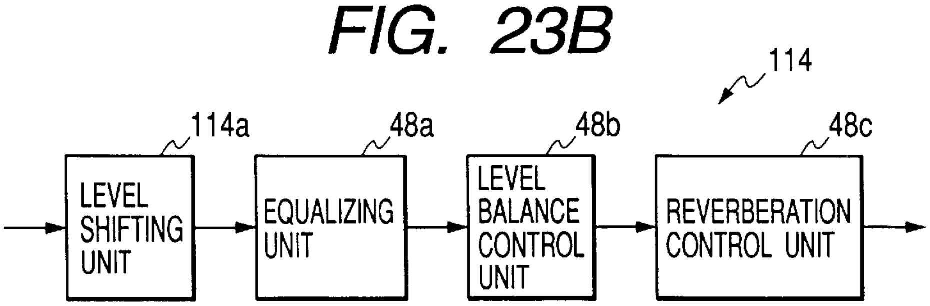
FIG. 23B is a block diagram of a level and sound quality control circuit of the signal processing circuit shown in FIG. 23A.

Thereafter, the level-shifted PCM audio data {Xbi, X2i−1, Xai, X2i} is transmitted to a level and sound quality control unit 114 formed of a digital signal processor. As shown in FIG. 23B, the level and sound quality control unit 114 comprises a level shifting unit 114*a*, the equalizing unit 48*a*, the level balance control unit 48*b* and the reverberation control unit 48*c*.

In the level shifting unit 114*a*, the level shift control data of the audio reproduction control information of the ACD information arranged in the audio-CONT pack is referred, and the shifted levels of the pieces of level-shifted PCM audio data are lowered by the differential level (0–Lmax2) indicated by the level shift control data according to the level control signal transmitted from the DVD decoding circuit 42 to reproduce the series of PCM audio data having the original levels for each channel. Therefore, even though the original levels of the pieces of PCM audio data are shifted to the shifted levels in the audio signal processing apparatus 100, the shifted levels of the pieces of level-shifted PCM audio data can be automatically returned to the original levels of the pieces of PCM audio data. Here, because the audio-CONT packs including the level shift control data are basically arranged at regular intervals of the audio time of 0.5 second, the differential level (0–Lmax2) can be automatically adjusted for each 0.5 second.

Thereafter, in the equalizing unit 48*a*, the level balance control unit 48*b* and the reverberation control unit 48*c*, the original levels of the pieces of PCM digital audio data are changed to set a music indicated by the analog audio signal input to the audio signal processing apparatus 100 to a user's desired sound quality, and a sound quality adjusted PCM digital audio signal composed of a series of sound quality adjusted PCM audio data are produced in the level and sound quality control unit 114.

Thereafter, a sound quality adjusted analog audio signal produced from the sound quality adjusted PcM audio signal in the D/A converter 45 or a band-limited PCM digital audio signal produced from the sound quality adjusted PCM audio signal in the low pass filter 56 is output from the audio signal reproducing apparatus 110 in the same manner as in the first embodiment. Also, the series of user data is output from the DVD decoding circuit 42 through the switch 51 in the same manner as in the first embodiment.

Accordingly, because the original levels of the PCM digital audio signals respectively expressed by 24 bits are shifted to produce the level-shifted PCM digital audio signals respectively expressed by 20 bits, a volume of data required for recording a music can be reduced.

Also, even though the original levels of the PCM digital audio signals are shifted to the shifted levels in the audio signal processing apparatus 100, the shifted levels of the pieces of level-shifted PCM audio data can be automatically returned to the original levels of the PCM digital audio signals, and the user can entertain a music having a desired sound quality selected by the user.

Next, a third embodiment relating to a mute control is described with reference to FIG. 25 to FIG. 31.

In this embodiment, a test tone signal set to an upper limit level of 0 dB is inserted into a series of analog audio signals in which each analog audio signal corresponds to one piece of packed data arranged in one audio pack, and a user adjusts levels of the analog audio signals by using the test tone signal of the known level when the series of analog audio signals indicating a music is reproduced. In this case, because the test tone signal is set to an upper limit level of 0 dB, assuming that the test tone signal is reproduced and output from a speaker, there is a probability that an output sound of the test tone signal gives an unpleasant feeling to the user, the speaker is broken or the user has a pain in his ear. Therefore, when the test tone signal is reproduced, a sound of the test tone signal is muted according to a mute control to prevent the test tone signal being output, and the user adjusts levels of the analog audio signals by using the reproduced test tone signal.

Figure 25:
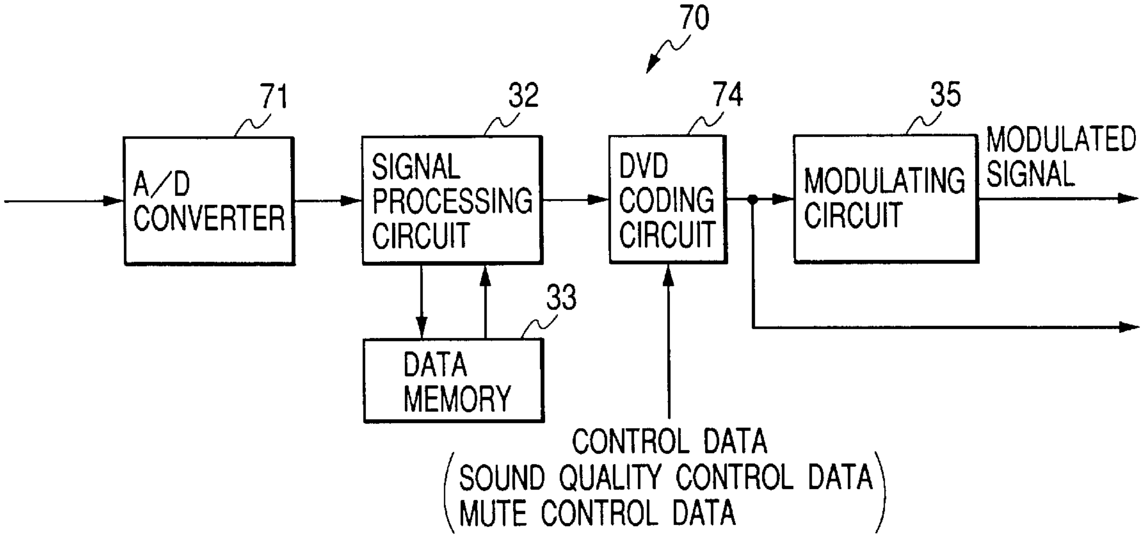
FIG. 25 is a block diagram of an audio signal processing apparatus used for performing an audio signal processing and reproducing method according to a third embodiment.

FIG. 25 is a block diagram of an audio signal processing apparatus according to a third embodiment.

As shown in FIG. 25, an audio signal processing apparatus 70 comprises:

- an analog-digital (A/D) converter 71 for receiving a series of analog audio signals indicating a music, in which a test tone signal is inserted, for each of a plurality of channels, and sampling each of the analog audio signals at a high sampling frequency for each channel to convert the analog audio signal to a pulse code modulation (PCM) digital audio signal composed of a series of PCM audio data;
- the signal processing circuit 32 for processing each PCM digital audio signal by producing a band limited digital audio signal composed of a series of band limited audio data from the PCM digital audio signal for each PCM digital audio signal, producing a sampling frequency reduced signal composed of a series of sampling frequency reduced data from the band limited digital audio signal for each band limited digital audio signal, producing a thinned-out audio signal composed of a series of thinned-out audio data from the PCM digital audio signal for each PCM digital audio signal and producing a differential audio signal composed of a series of differential audio data from the thinned-out audio signal and the sampling frequency reduced signal for each set of the thinned-out audio signal and the sampling frequency reduced signal and producing a series of user data composed of one series of sampling frequency reduced data and one series of differential audio data for each PCM digital audio signal;
- the data memory 33 for temporarily storing the series of PCM audio data, the series of band limited audio data, the series of sampling frequency reduced data, the series of thinned-out audio data and the series of differential audio data produced in the signal processing circuit 32;
- a DVD encoding circuit 74 for encoding and packing pieces of control data including sound quality control data and mute flag data (denoting a mute flag Fm) and a plurality of series of user data to produce packed data for each of a plurality of groups of PCM digital audio signals; and
- the modulating circuit 35 for modulating one piece of packed data produced by the DVD encoding circuit 74 to a modulated signal for each piece of packed data.

In the above configuration, an operation of the audio signal processing apparatus 70 is described.

Figure 26A:
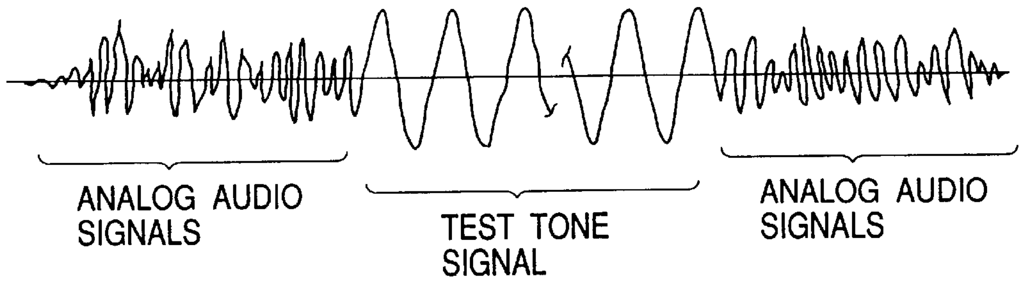
FIG. 26A shows a series of analog audio signals and a test tone signal inserted into the series of analog audio signals which are input to the audio signal processing apparatus shown in FIG. 25.

A series of analog audio signals extending for one hour is received by the A/D converter 71, and a PCM digital audio signal is produced from each analog audio signal. As shown in FIG. 26A, a test tone signal extending for ten seconds is inserted into the series of analog audio signals. The test tone signal is formed of a series of sine waves of 400 Hz, and a level of the test tone signal is equal to an upper limit level of 0 dB.

Figure 26B:
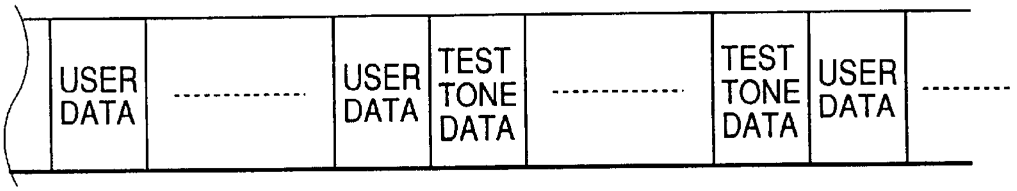
FIG. 26B shows a plurality of series of test tone data arranged in series in a plurality of series of user data which are reproduced in a signal processing circuit of the audio signal processing apparatus shown in FIG. 25.

Thereafter, a series of user data is produced from each PCM digital audio signal in the signal processing circuit 32 in the same manner as in the first embodiment, so that a plurality of series of user data are produced from each group of PCM digital audio signals. In this case, as shown in FIG. 26B, a plurality of series of test tone data are arranged in series in the plurality of series of user data. Thereafter, pieces of control data including sound quality control data and mute flag data are packed with a plurality of series of user data in the DVD coding circuit 74 to produce packed data for each group of PCM digital audio signals. Thereafter, a series of packed data is modulated to a series of modulated signals in the modulating circuit 35, and the series of modulated signals is recorded in the DVD-audio disk 7. The DVD-audio format for the packed data is shown in FIG. 5B, FIG. 6, FIG. 7, FIG. 8, FIG. 9 and FIG. 11.

Also, a plurality of series of user data corresponding to video signals are produced and recorded in the same manner, and the DVD-video format for the plurality of series of user data is shown in FIG. 5A.

Figure 27:
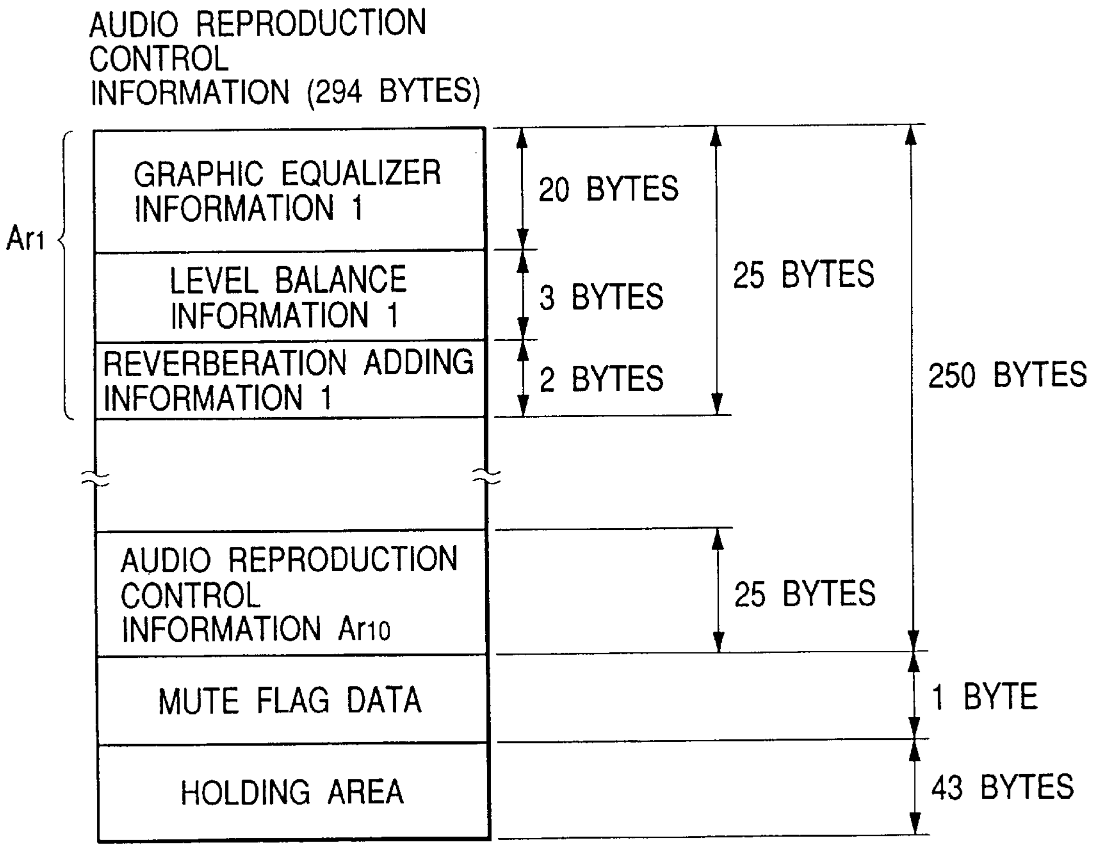
FIG. 27 shows a data format of an area of audio reproduction control information arranged in the audio character display information shown in FIG. 9, according to the third embodiment.

FIG. 27 shows a data format of an area of audio reproduction control information arranged in the audio character display information shown in FIG. 9, according to the third embodiment.

As shown in FIG. 27, the area of the audio reproduction control information shown in FIG. 9 is composed of areas of ten pieces of audio reproduction control information Ar1 to Ar10 (respectively denoting sound quality control data) respectively having 25 bytes, an area of mute flag data (1 byte) and a holding area of 44 bytes. Each piece of audio reproduction control information Ari is composed of graphic equalizer information of 20 bytes, level balance information of 3 bytes and reverberation adding information of 2 bytes in the same manner as in the first embodiment. The audio reproduction control information including the mute flag data is arranged in each A-CONT pack, and each piece of packed data is composed of one A-CONT pack and a plurality of audio packs following the A-CONT pack. Also, the mute flag data arranged in each A-CONT pack indicates a mute flag Fm.

In cases where one series of test tone data is arranged in one of audio packs following one A-CONT pack, a mute flag Fm of the A-CONT pack is set to 1 (Fm=1) in the DVD coding circuit 74. In contrast, one series of test tone data is not arranged in any audio pack following one A-cONT pack, a mute flag Fm of the A-CONT pack is set to 0 (Fm=0) in the DVD coding circuit 74.

Next, an audio signal reproducing apparatus, in which a series of analog audio signals having a test tone signal is reproduced from the packed data produced in the audio signal processing apparatus 70 and levels of analog audio signals are adjusted according to a mute control by using the test tone signal, is described.

In this mute control, when a user inputs a mute instruction or a mute flag Fm set to 1 is detected, the outputting of the series of analog audio signals is stopped to mute an output sound of the test tone signal.

Figure 28:
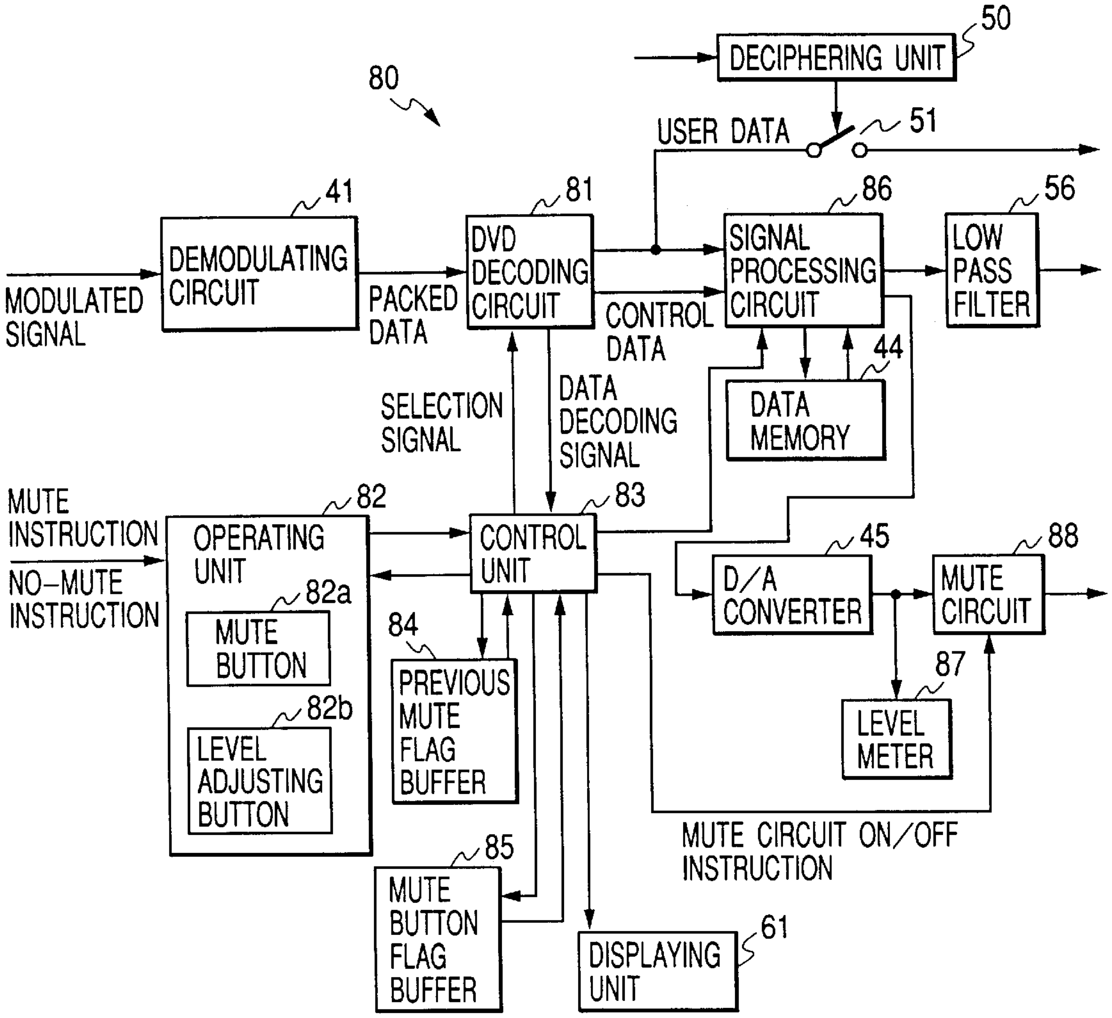
FIG. 28 is a block diagram of an audio signal reproducing apparatus according to the third embodiment.
Figure 29:
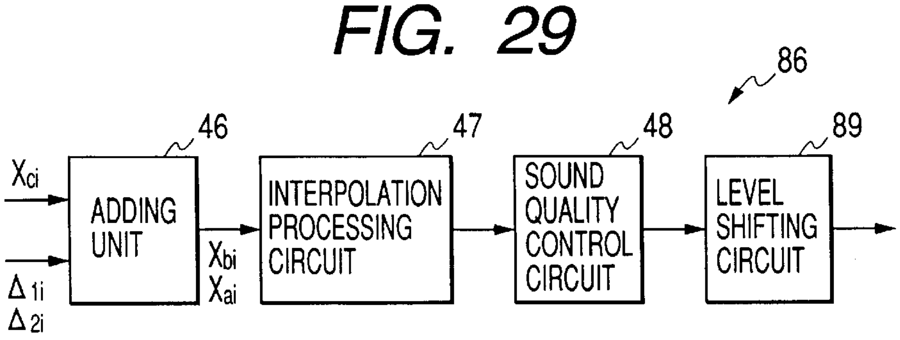
FIG. 29 is a block diagram of a signal processing circuit of the audio signal reproducing apparatus shown in FIG. 28.

FIG. 28 is a block diagram of an audio signal reproducing apparatus according to the third embodiment.

As shown in FIG. 28, an audio signal reproducing apparatus 80 comprises

- the demodulating circuit 41 for demodulating a series of modulated signal, which is produced in the modulating circuit 35 of the audio signal processing apparatus 70 and is recorded in the DVD-audio disk 7, to reproduce a series of packed data;
- a DVD decoding circuit 81 for decoding one piece of packed data to a plurality of series of user data of audio packs and pieces of control data of one audio-control pack for each piece of packed data, outputting a mute flag Fm of the audio-control pack and a data decoding signal indicating the decoding of the packed data, the pieces of audio reproduction control information Ar1 to Ar10 being included in the control data;
- the displaying unit 61 for displaying an image requesting the user to select one of the pieces of audio reproduction control information Ar1 to Ar10 according to the data decoding signal received from the DVD decoding circuit 42;
- an operating unit 82 having a mute button 82*a* and a level adjusting button 82*b* for receiving a data selection instruction of the user indicating the selection of one piece of particular audio reproduction control information displayed on the displaying unit 61, receiving the pushing of the mute button 82*a* indicating the alternate selection of a mute instruction and a no-mute instruction and receiving a level adjusting instruction indicating the adjustment of a level of a digital audio signal when the user pushes the level adjusting button 82*b;*
- a control circuit 83 for controlling the displaying unit 61 according to the data decoding signal received from the DVD decoding circuit 81, outputting a selection signal indicating one piece of particular audio reproduction control information selected by the data selection instruction to the DVD decoding circuit 81, judging whether the pushing of the mute button 82*a* received in the operating unit 82 indicates a mute instruction or a no-mute instruction, performing a mute control according to the mute instruction or the mute flag Fm transmitted from the DVD decoding circuit 81, outputting a mute circuit on/off instruction produced as a result of the mute control and producing level control data indicating the change of a level of each PCM digital audio signal according to the level adjusting instruction transmitted from the operating unit 82, the particular audio reproduction control information being output from the DVD decoding circuit 81 according to the selection signal;
- a previous mute flag buffer 84 for storing the mute flag Fm transmitted from the DVD decoding circuit 81 through the control circuit 83 as a previous mute flag Fpm under the control of the control unit 83 just after the mute control performed in the control unit 83 is finished;
- a mute button flag buffer 85 for storing a mute button flag indicating the mute instruction or the no-mute instruction judged by the control unit 83;
- a signal processing circuit 86 for reproducing a plurality of PCM digital audio signals from the plurality of series of user data reproduced in the DVD decoding circuit 81, changing levels of the pieces of PCM audio data of each PCM digital audio signal according to the particular audio reproduction control information transmitted from the DVD decoding circuit 81 to produce a plurality of sound quality adjusted PCM digital audio signals in which a sound quality of a music indicated by the PCM digital audio signals is appropriately adjusted to a user's desired sound quality, uniformly changing the levels of the sound quality adjusted PCM digital audio signals according to the level control data transmitted from the control circuit 83;
- the data memory 44 for temporarily storing the series of user data, the series of band limited audio data, the series of sampling frequency reduced data, the series of thinned-out audio data and the series of differential audio data produced in the signal processing circuit 86;
- the D/A converter 45 for converting the sound quality adjusted PCM digital audio signals into a plurality of sound quality adjusted analog audio signals for each channel;
- a level meter 87 for indicating levels of the sound quality adjusted analog audio signals obtained in the D/A converter 45 for each channel;
- a mute circuit 88 of an analog type for muting an output sound of the sound quality adjusted analog audio signals of all channels according to the mute circuit on/off instruction transmitted from the control circuit 83;
- the low pass filter 56; and the deciphering unit 50.

In the above configuration of the audio signal reproducing apparatus 80, a series of modulated signals recorded in the DVD-audio disk 7 is read out and is demodulated in the demodulating circuit 41, so that a series of packed data is reproduced. Thereafter, each piece of packed data is decoded in the DVD decoding circuit 81, and a plurality of series of user data of audio packs and pieces of control data of one audio-control pack are obtained for each piece of packed data. Thereafter, a mute flag Fm of the audio-control pack and a data decoding signal indicating the decoding of the packed data are transmitted to the control unit 83, and the plurality of series of user data of audio packs and the pieces of control data of the audio-control pack are transmitted to the signal processing circuit 86.

Thereafter, the plurality of series of user data are processed in the signal processing circuit 86 in the same manner as in the signal processing circuit 43 of the first embodiment, so that a plurality of sound quality adjusted PCM digital audio signals is reproduced. Thereafter, the plurality of sound quality adjusted PCM digital audio signals are converted in the D/A converter 45 to reproduce a plurality of sound quality adjusted analog audio signals, and levels of the sound quality adjusted analog audio signals are indicated in the level meter 87. Therefore, when the test tone signal included in the sound quality adjusted analog audio signals are reproduced in the D/A converter 45, the level meter 87 indicates an upper limit level.

Thereafter, because a user observes a level change in the level meter 87, when the level meter 87 indicates an upper limit level, the user can recognizes that the test tone signal is reproduced. Therefore, the user operates the level adjusting button 82*b* to reduce an output level of the test tone signal to a desired output level such as −10 dB. When the user operates the level adjusting button 82*b*, a level adjusting instruction indicating the adjustment of a level of a digital audio signal relating to the test tone signal is transmitted to the control unit 83, level control data indicating a differential strength between the upper limit level and the desired output level is transmitted from the control unit 83 to the signal processing circuit 86, and the levels of the sound quality adjusted PCM digital audio signals are uniformly reduced by the differential strength according to the level control data in a level shifting circuit 89 shown in FIG. 29.

Accordingly, an output sound of a music indicated by the reproduced analog audio signals can be easily adjusted.

Also, assuming that the test tone signal is output, because a level of the test tone signal is high, the test tone signal gives an unpleasant feeling to the user. Therefore, when a group of PCM digital audio signals relating to the test tone signal is reproduced in the signal processing circuit 86, a mute control is performed in the control unit 83 to mute an output sound of the test tone signal reproduced in the D/A converter 45.

Figure 30:
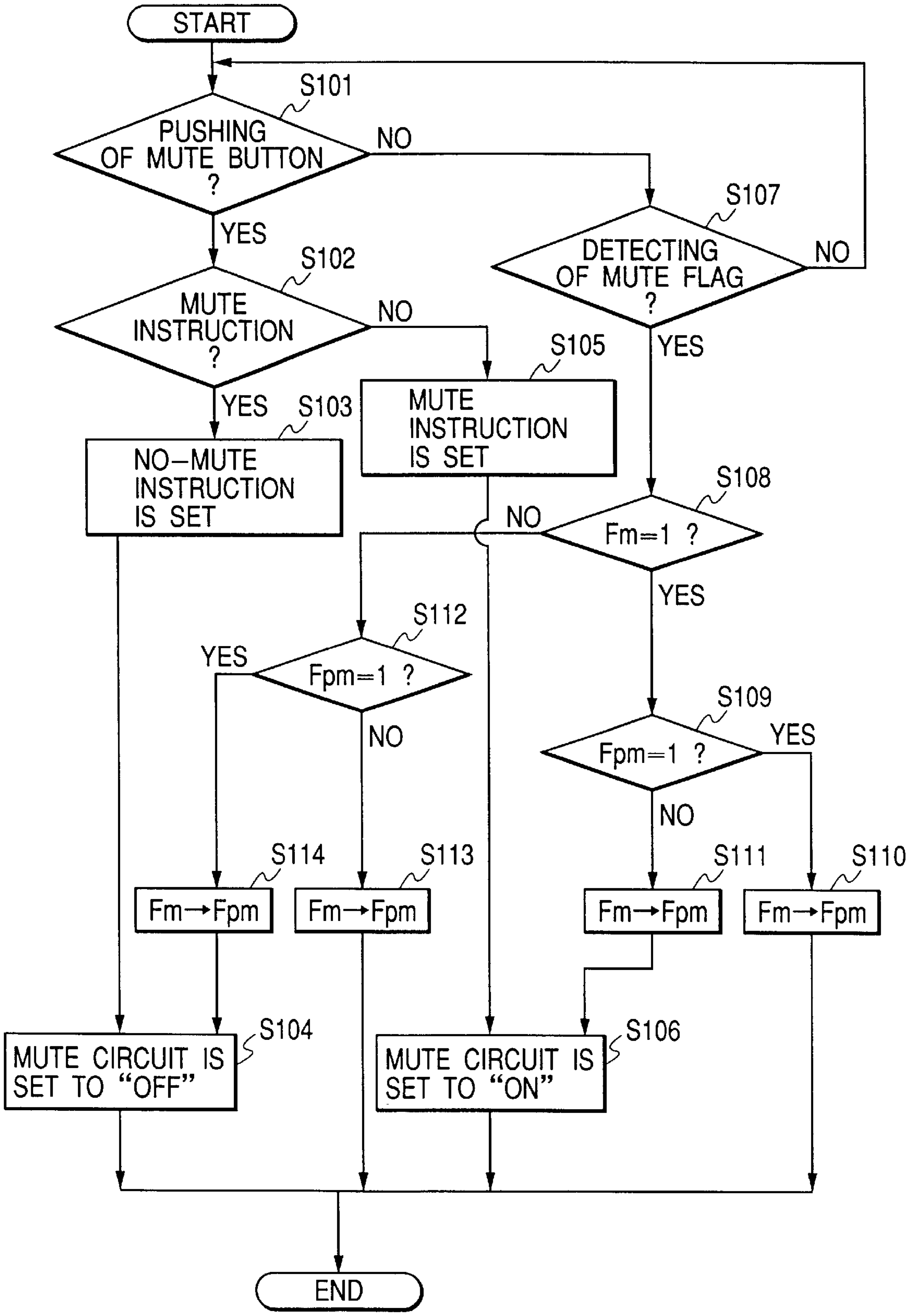
FIG. 30 is a flow chart showing a routine of a mute control performed in a control unit of the audio signal reproducing apparatus according to the third embodiment.

FIG. 30 is a flow chart showing a routine of a mute control performed in the control unit 83 according to the third embodiment.

As shown in FIG. 30, it is judged in a step S101 whether or not the mute button 82*a* is pushed by the user to change a mute instruction previously indicated by the user to a no-mute instruction currently indicated by the user or to change a no-mute instruction previously indicated by the user to a mute instruction currently indicated by the user.

In cases where the pushing of the mute button 82*a* is judged, it is judged in a step S102 whether or not a mute button flag stored in the mute button flag buffer 85 indicates a mute instruction. The mute button flag is set when the pushing of the mute button 82*a* is judged in a previous routine of the mute control, and the mute instruction and the no-mute instruction of the mute button flag are alternately selected each time the pushing of the mute button 82*a* is judged.

In cases where the mute button flag indicates a mute instruction, because the mute instruction is selected in a previous routine of the mute control, the indication of the mute button flag is changed to a no-mute instruction in a step S103. Thereafter, because the pushing of the mute button 82*a* currently performed by the user indicates the no-mute instruction, the mute control is not selected, and the mute circuit 88 is set to a "OFF" condition in a step S104. That is, the operation of the mute circuit 88 is stopped. Therefore, the sound quality adjusted analog audio signals are output from the audio signal reproducing apparatus 80, and the user can listen to a music.

In contrast, in cases where the mute button flag indicates a no-mute instruction in the step S102, because the no-mute instruction is selected in a previous routine of the mute control, the indication of the mute button flag is changed to a mute instruction in a step S105. Thereafter, because the pushing of the mute button 82*a* currently performed by the user indicates the mute instruction, the mute control is selected, and the mute circuit 88 is set to a "ON" condition in a step S106. That is, the mute circuit 88 is set to an operation condition. Therefore, an output sound of the sound quality adjusted analog audio signals is muted in the mute circuit 88, so that the user cannot listen to a music.

Accordingly, the user can manually and alternately select the performance of mute control and the no-performance of mute control by pushing the mute button 82*a*.

Also, in cases where the pushing of the mute button 82*a* is not judged in the step S101, it is judged in a step S107 whether or not a mute flag Fm arranged in an A-CONT pack is detected. Because a plurality of A-CONT packs are arranged at normal intervals of 0.5 second, the mute flag is detected every 0.5 second. In cases where any mute flag is not detected, the judgement in the step S101 is repeated.

In contrast, in cases where a mute flag Fm is detected in the step S107, a mute control based on the mute flag is started in this current routine. That is, it is judged in a step S108 whether the mute flag Fm is equal to 1 or 0. In cases where the mute flag Fm=1 is satisfied because the mute circuit 88 set to the "ON" condition is required. it is judged in a step S109 whether a previous mute flag Fpm stored in the previous mute flag buffer 84 is equal to 1 or 0. In cases where the previous mute flag Fpm=1 is satisfied, because the mute circuit 88 has been already set to the "ON" condition in a previous routine of the mute control, even though the mute flag Fm=1 instructs the operation of the mute circuit 88 in this current routine, the setting of the mute circuit 88 to the "ON" condition in the step S106 is not required. Therefore, the mute flag Fm is stored in the previous mute flag buffer 84 as a previous mute flag Fpm currently defined in a step S110, and the current routine is finished. The previous mute flag Fpm currently defined is used for a next routine of a mute control based on a next mute flag.

In contrast, in cases where the previous mute flag Fpm=0 is satisfied in the step S109, because the mute circuit 88 is set to the "OFF" condition in a previous routine of the mute control, the mute flag Fm is stored in the previous mute flag buffer 84 as a previous mute flag Fpm currently defined in a step S111, the mute circuit 88 is set to the "ON" condition in the step S106, and the current routine is finished.

Also, in cases where the mute flag Fm=0 is satisfied in the step S108 because the mute circuit 88 set to the "OFF" condition is required in this current routine, it is judged in a step S112 whether a previous mute flag Fpm stored in the previous mute flag buffer 84 is equal to 1 or 0. In cases where the previous mute flag Fpm=0 is satisfied, because the mute circuit 88 has been already set to the "OFF" condition in a previous routine of the mute control, even though the mute flag Fm=0 instructs the stopping of the operation of the mute circuit 88 in this current routine, the setting of the mute circuit 88 to the "OFF" condition in the step S104 is not required. Therefore, the mute flag Fm is stored in the previous mute flag buffer 84 as a previous mute flag Fpm currently defined in a step S113, and the current routine is finished.

In contrast, in cases where the previous mute flag Fpm=1 is satisfied in the step S112, because the mute circuit 88 is set to the "ON" condition in a previous routine of the mute control, the mute flag Fm is stored in the previous mute flag buffer 84 as a previous mute flag Fpm currently defined in a step S114, the mute circuit 88 is set to the "OFF" condition in the step S104, and the current routine is finished.

Accordingly, in cases where the mute flag Fm=1 arranged in one A-CONT pack is detected, because one series of test tone data is arranged in one of audio packs following the A-CONT pack, the mute circuit 88 can be automatically set to the "ON" condition to mute an output sound of the test tone signal obtained from the series of test tone data. Therefore, there is no probability that an output sound of the test tone signal gives an unpleasant feeling to the user, the speaker is broken or the user has a pain in his ear.

Also, in cases where the mute flag Fm=0 arranged in one A-CONT pack is detected, because a series of test tone data is not arranged in any audio pack following the A-CONT pack, the mute circuit 88 can be automatically set to the "OFF" condition to output a music indicated by a plurality of analog audio signals relating to a plurality of series of user data which are arranged in a plurality of audio packs following the A-CONT pack. Therefore, the user can entertain the music without being disturbed by the test tone signal.

Also, because a plurality of A-CONT packs are arranged at normal intervals of 0.5 second, a mute flag arranged in each A-CONT pack is detected every 0.5 second. Therefore, the burden of the control unit 83 for observing the occurrence of the mute flag in the DVD decoding circuit 81 can be reduced as compared with the observation performed for each frame (1/600 second) in the prior art.

Next, a modification of the third embodiment is described.

Figure 31:
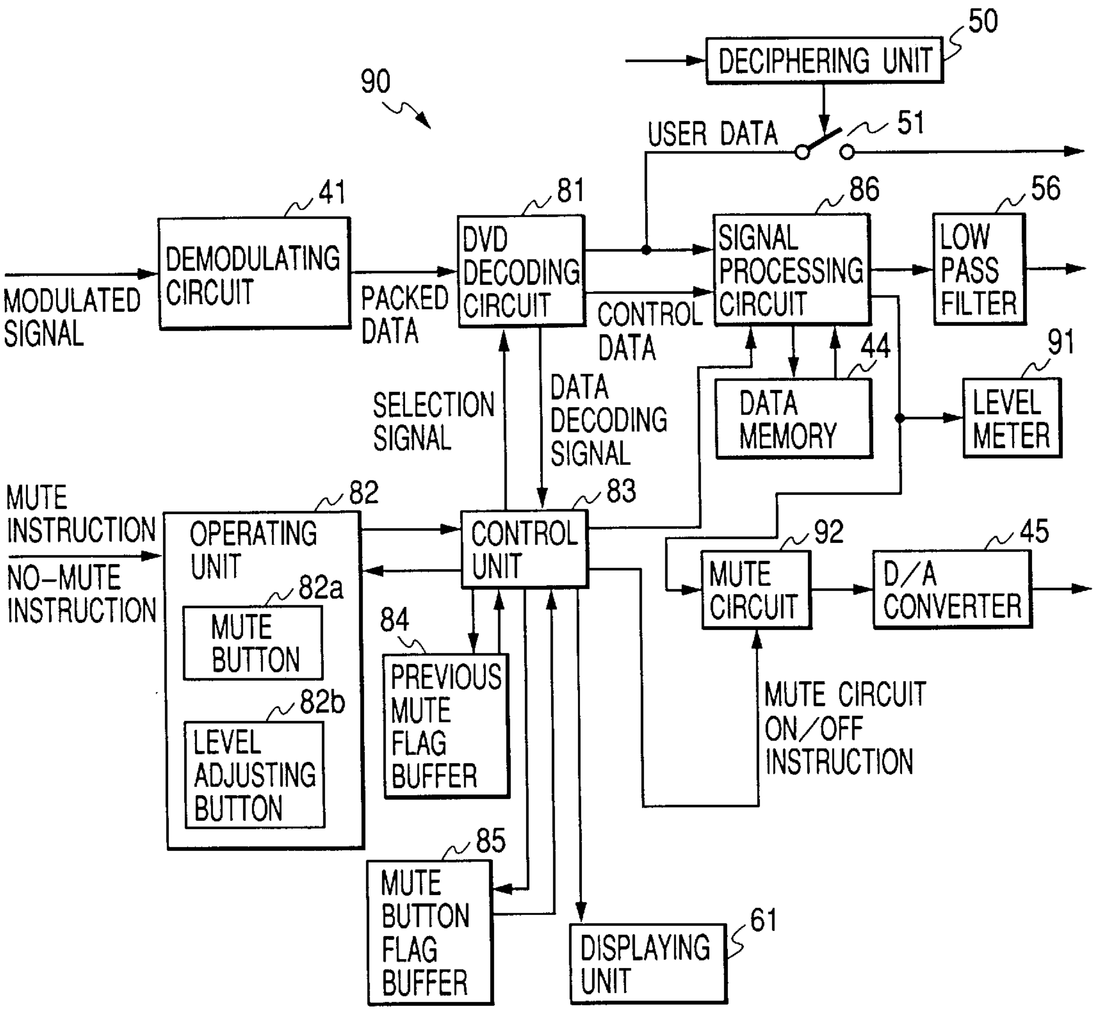
FIG. 31 is a block diagram of an audio signal reproducing apparatus according to a modification of the third embodiment.

FIG. 31 is a block diagram of an audio signal reproducing apparatus according to a modification of the third embodiment.

As shown in FIG. 31, an audio signal reproducing apparatus 90 comprises the demodulating circuit 41, the DVD decoding circuit 81, the displaying unit 61, the operating unit 82, the control circuit 83, the previous mute flag buffer 84, the mute button flag buffer 85, the signal processing circuit 86, the data memory 44, a level meter 91 for indicating levels of the sound quality adjusted PCM digital audio signals obtained in the signal processing circuit 86 for each channel, a mute circuit 92 of a digital type for muting an output sound of the sound quality adjusted PCM digital audio signals of all channels obtained in the signal processing circuit 86 according to the mute circuit on/off instruction transmitted from the control circuit 83, the D/A converter 45, the low pass filter 56 and the deciphering unit 50.

In the above configuration, because an output sound of a digital audio signal relating to the test tone signal is automatically muted, the user can easily adjust levels of the sound quality adjusted PCM digital audio signals without any unpleasant feeling based on the output of the test tone signal.

Having illustrated and described the principles of the present invention in a preferred embodiment thereof, it should be readily apparent to those skilled in the art that the invention can be modified in arrangement and detail without departing from such principles. We claim all modifications coming within the scope of the accompanying claims.

What is claimed is:

1. An audio signal processing and reproducing method, comprising the steps of:

converting analog audio signals of multiple channels into multiple digital data streams corresponding to the multiple channels, the multiple digital data streams having original maximum levels which are different from each other;

producing level-shift control data responsive to a highest level among the original maximum levels of the multiple digital data streams;

shifting levels of all the multiple digital data streams by a determined amount determined by the level-shift control data and resulting level-shifted data streams corresponding to the multiple channels;

coding the level-shifted data streams and the level-shift control data to produce a packed data stream in a predetermined format to be transmitted or recorded;

transmitting or recording the level-shifted data streams and the level-shift control data on a recording medium in a disc shape;

decoding the packed data stream in a predetermined format to reproduce the level-shifted data streams and the level-shift control data;

recovering the original maximum levels of the multiple digital data streams by adjusting levels thereof responsive to the level-shift control data transmitted or recorded; and outputting the multiple digital data streams having the original maximum levels thus recovered.

2. The audio signal processing and reproducing method according to claim 1, in which the step of coding the level-shifted data streams and the level-shift control data comprises the steps of:

limiting a frequency band of each of the level-shifted data streams to produce band-limited data stream;

removing pieces of data from the band-limited data stream at prescribed intervals to produce a sampling-frequency reduced data stream {Xci) ("i" is a positive integer) from the band-limited data stream;

thinning out pieces of data in each of the level-shifted data streams at another prescribed intervals to produce a thinned-out data stream {Xbi, Xai} in which a number of data is twice much a number of data in the sampling-frequency reduced data stream;

calculating a difference $\Delta 1i = Xbi - Xci$ between the thinned-out data stream Xbi and the sampling-frequency reduced data stream Xci to produce a first differential data stream {Δ1i} calculating a difference $\Delta 2i = Xai - Xci$ between the thinned-out data stream Xai and the sampling-frequency reduced data stream Xci to produce a second differential data stream {Δ2i} packing the sampling-frequency reduced data stream (Xci], the first differential data stream {Δ1i} and the second differential data stream {Δ2i} to produce a user data stream (Xci, {Δ1i}, {Δ2i}; and packing the user data stream of the multiple channels and the level-shifted control data to produce the packed data Stream.

3. The audio signal processing and reproducing method according to claim 1, in which multiple audio reproduction control information respectively including information for adjusting sound quality are added to the multiple digital data streams.

* * * * *